(12) United States Patent
Balakrishnan et al.

(10) Patent No.: US 9,748,385 B1
(45) Date of Patent: Aug. 29, 2017

(54) METHOD FOR FORMING VERTICAL SCHOTTKY CONTACT FET

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/216,383

(22) Filed: Jul. 21, 2016

(51) Int. Cl.
*H01L 29/78* (2006.01)
*H01L 29/786* (2006.01)
*H01L 29/423* (2006.01)
*H01L 29/49* (2006.01)
*H01L 29/66* (2006.01)

(52) U.S. Cl.
CPC .... *H01L 29/7839* (2013.01); *H01L 29/42392* (2013.01); *H01L 29/4966* (2013.01); *H01L 29/66666* (2013.01); *H01L 29/66742* (2013.01); *H01L 29/78618* (2013.01); *H01L 29/78642* (2013.01); *H01L 29/78696* (2013.01)

(58) Field of Classification Search
CPC ............ H01L 29/7839; H01L 29/4966; H01L 29/42392; H01L 29/66742
See application file for complete search history.

(56) References Cited

U.S. PATENT DOCUMENTS

2015/0091058 A1* 4/2015 Doyle ................. H01L 29/7827
257/192
2015/0364381 A1* 12/2015 Choi ............... H01L 21/823487
438/268

* cited by examiner

*Primary Examiner* — Dung Le
(74) *Attorney, Agent, or Firm* — Scully, Scott, Murphy & Presser, P.C.; Louis J. Percello, Esq.

(57) ABSTRACT

A semiconductor structure containing a vertical Schottky contact transistor is provided in which the contact resistance as well as the junction resistance is improved. The vertical Schottky contact transistor includes a bottom Schottky contact source/drain structure and a top Schottky contact source/drain structure located at opposing ends of a semiconductor channel region. The bottom Schottky contact source/drain structure includes a base portion and a vertically extending portion.

10 Claims, 25 Drawing Sheets

METHOD FOR FORMING VERTICAL SCHOTTKY CONTACT FET

BACKGROUND

The present application relates to a semiconductor structure and a method of forming the same. More particularly, the present application relates to a semiconductor structure having improved junction resistance and contact resistance, and containing a vertical Schottky contact transistor located on a substrate, and a method of forming the same.

Vertical transistors are an attractive option for technology scaling for 5 nm and beyond technologies. Vertical transistors have a channel oriented perpendicular to the substrate surface, as opposed to being situated along the plane of the surface of the substrate in the case of a lateral transistor. By using a vertical design, it is possible to increase packing density. That is, by having the channel perpendicular to the substrate, vertical transistors improve the scaling limit beyond lateral transistors.

Access resistance of the contact to the bottom source/drain structure to the vertical channel is one major problem for performance gain hoped for in a vertical transistor. As such, there is a need for providing a vertical transistor in which the access resistance problem mentioned above is circumvented to at least some degree.

SUMMARY

A semiconductor structure containing a vertical Schottky contact transistor is provided in which the contact resistance as well as the junction resistance is improved. The vertical Schottky contact transistor includes a bottom Schottky contact source/drain structure and a top Schottky contact source/drain structure located at opposing ends of a semiconductor channel region. The bottom Schottky contact source/drain structure includes a base portion (which serves as one of the source region or the drain region) and a vertically extending portion (which serves as a contact to the source region or drain region); the vertically extending portion and the base portion of the bottom Schottky contact source/drain structure are of unitary construction (i.e., a single piece). The top Schottky contact source/drain region serves as the other of the source region or the drain region.

In one aspect of the present application, a semiconductor structure is provided. In one embodiment of the present application, the semiconductor structure may include a vertical field effect transistor located above a substrate. The vertical field effect transistor includes a bottom Schottky contact source/drain structure located directly on a surface of the substrate. The bottom Schottky contact source/drain structure comprises a base portion and a vertically extending portion. The vertical field effect transistor further includes a semiconductor channel region extending vertically upwards from a surface of the base portion of the bottom Schottky contact source/drain structure, a top Schottky contact source/drain structure located on a topmost surface of the semiconductor channel region, and a gate structure located on each side of the semiconductor channel region. In the present application, the vertically extending portion of the bottom Schottky contact source/drain structure has a topmost surface that is coplanar with a topmost surface of the top Schottky contact source/drain structure.

In another aspect of the present application, a method of forming a semiconductor structure is provided. In one embodiment of the present application, the method may include providing a structure on a surface of a substrate, the structure comprising a semiconductor channel material structure extending vertically upwards from a surface of a silicon germanium alloy layer, wherein a dielectric cap is located on a topmost surface of the semiconductor channel material structure, a bottom spacer is located on each side of the semiconductor channel material structure and in direct contact with the silicon germanium alloy layer, and a top spacer is located on each side of the semiconductor channel material structure and is spaced apart from the bottom spacer. Next, a gate structure is formed on each side of the semiconductor channel material structure, wherein each gate structure comprises a gate dielectric material portion directly contacting an exposed sidewall surface of the semiconductor channel material structure. A middle-of-the-line (MOL) dielectric material is formed adjacent the gate structures and the semiconductor channel material structure. The dielectric cap is then removed to expose the topmost surface of the semiconductor channel material structure. Next, the semiconductor channel material structure is recessed to provide a semiconductor channel region, and thereafter a contact opening is formed in the MOL dielectric material that exposes another surface of the silicon germanium alloy layer. The silicon germanium alloy layer is then removed to provide a cavity. Next, a conductive material is formed in the contact opening, the cavity, and atop the semiconductor channel region. The conductive material in the contact opening and the cavity provides a bottom Schottky contact source/drain region containing a vertically extending portion and a base portion, and the conductive material formed atop the semiconductor channel region forms a top Schottky contact source/drain region.

DETAILED DESCRIPTION

Figure 1:
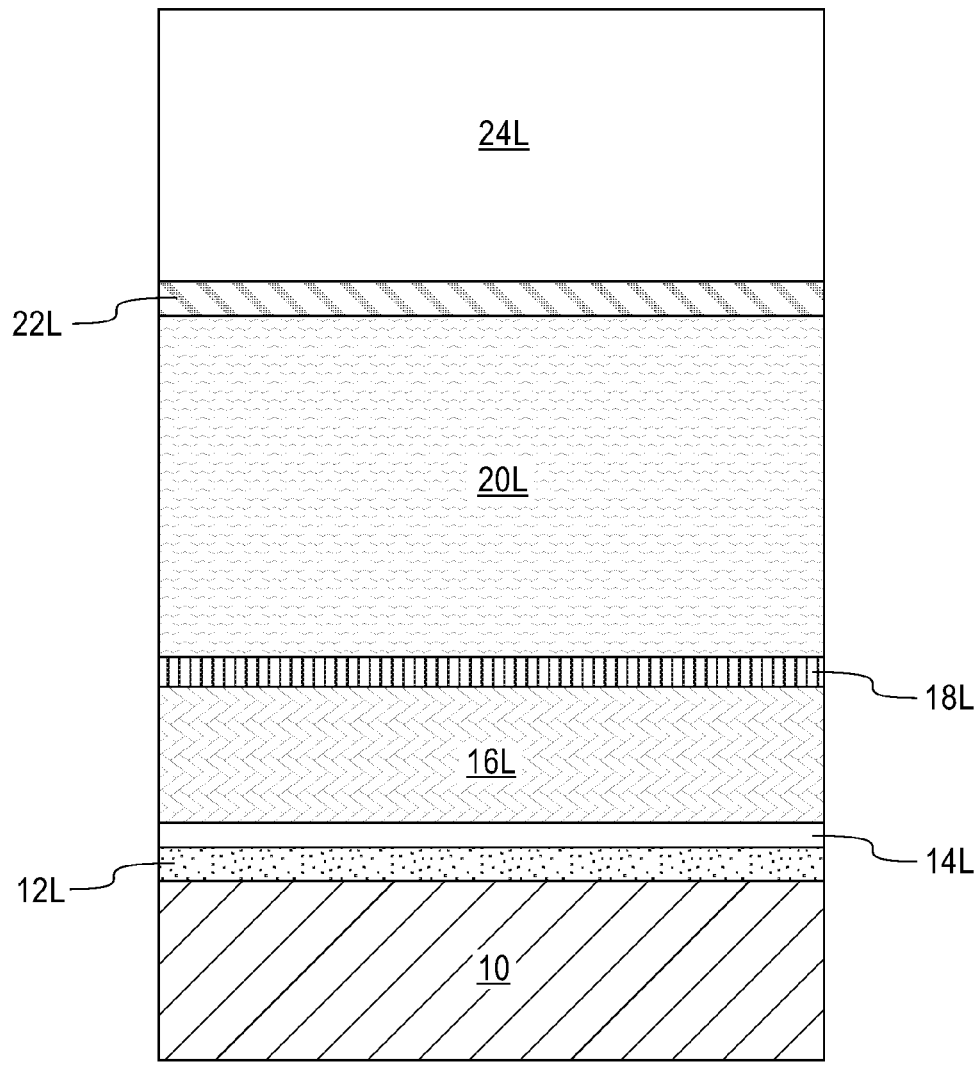
FIG. 1 is a cross sectional view of an exemplary semiconductor structure including a material stack of a bulk semiconductor substrate, a first semiconductor material layer of a first conductivity type, a second semiconductor material layer of a second conductivity type different from the first conductivity type, a silicon germanium alloy layer, a bottom spacer layer, a sacrificial gate material layer, a top spacer layer and a dielectric material layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 24:
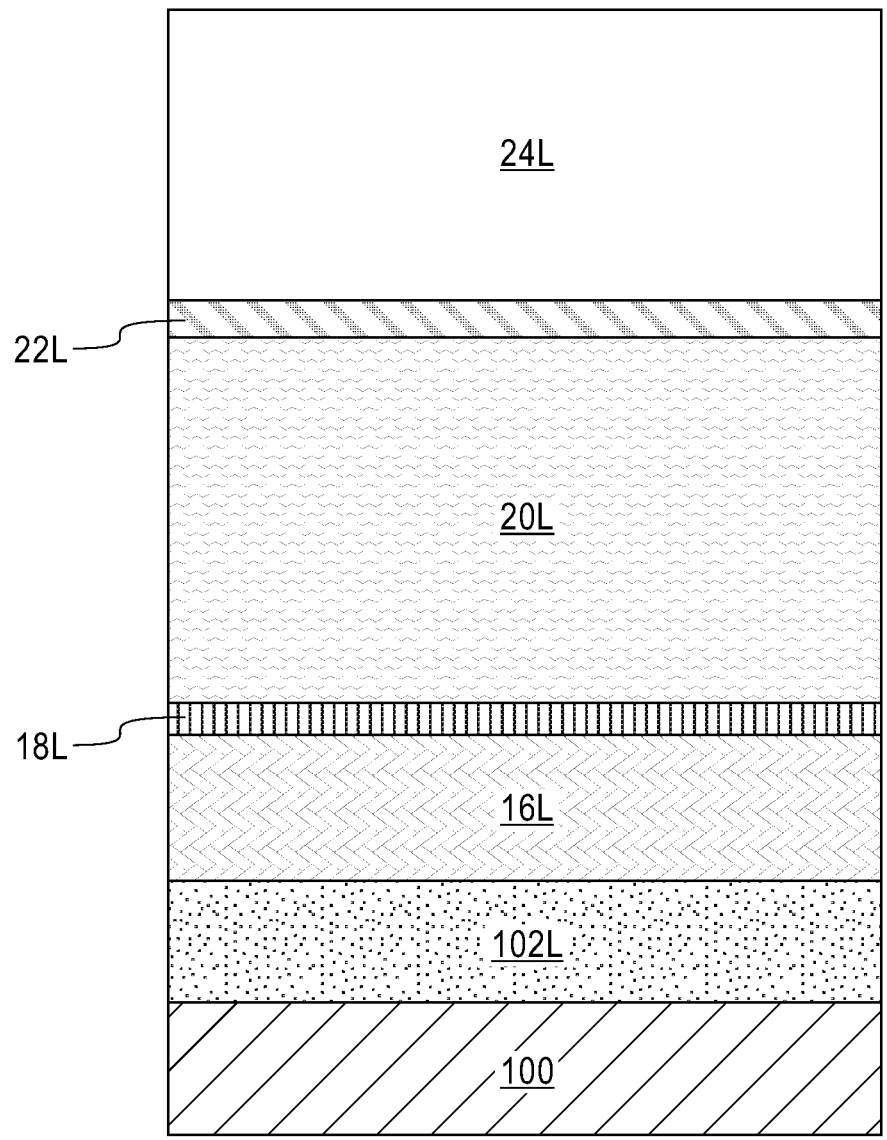
FIG. 24 is a cross sectional view of another exemplary semiconductor structure including a material stack of a handle substrate, an insulator layer, a silicon germanium alloy layer, a bottom spacer layer, a sacrificial gate material layer, a top spacer layer and a dielectric material layer that can be employed in another embodiment of the present application.
Figure 25:
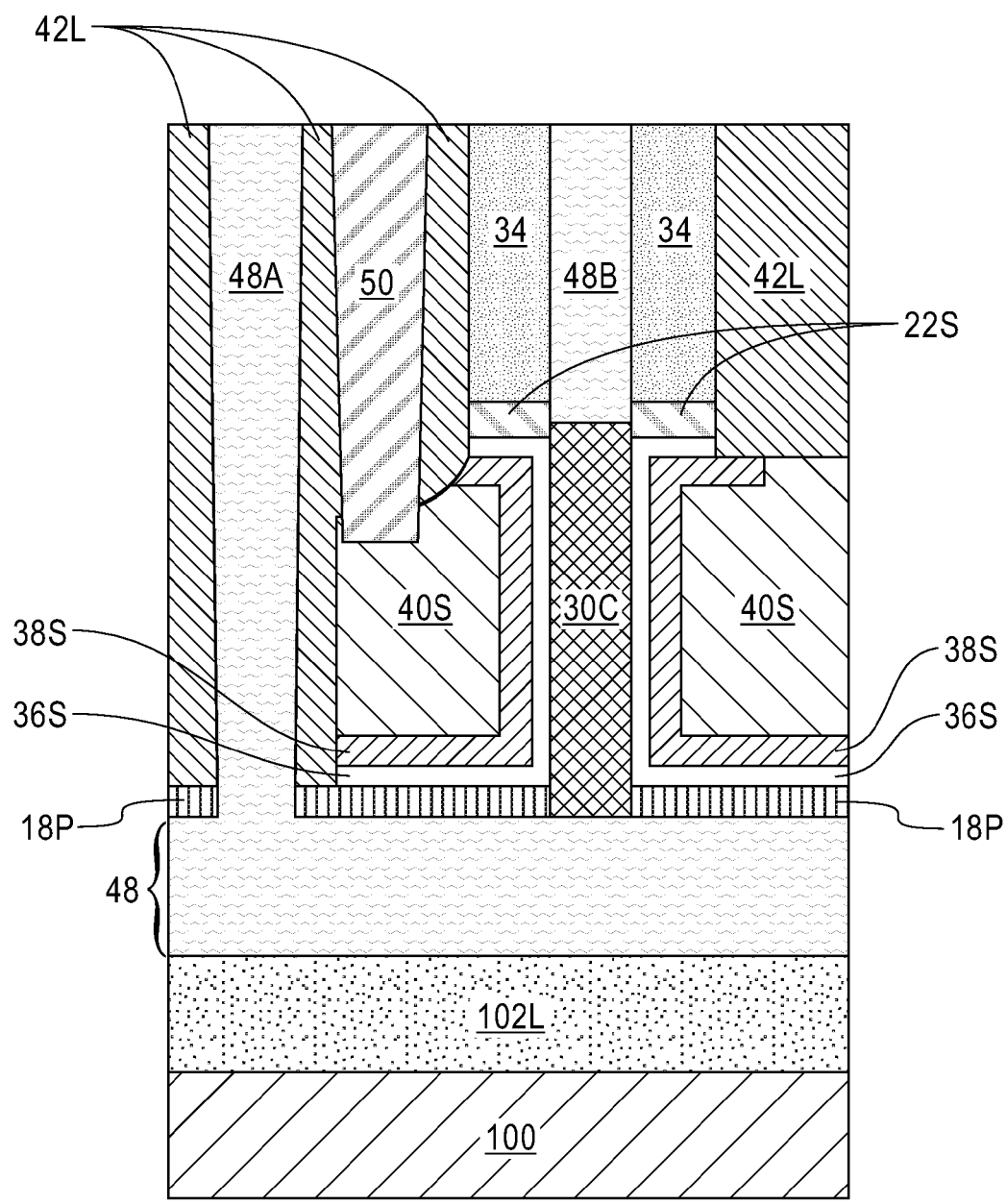
FIG. 25 is a cross sectional view of the exemplary semiconductor structure of FIG. 24 after performing the various processing steps mentioned in FIGS. 2-23 of the present application.

Referring first to FIGS. 1-23, there are illustrated one exemplary semiconductor structure of the present application through various processing steps in which a bulk semiconductor substrate is employed; FIGS. 24-25 illustrate another exemplary semiconductor structure of the present application in which a semiconductor-on-insulator (SOI) substrate is employed.

Notably, FIG. 1 illustrates an exemplary semiconductor structure including a material stack of a bulk semiconductor substrate 10, a first semiconductor material layer 12L of a first conductivity type, a second semiconductor material layer 14L of a second conductivity type different from the first conductivity type, a silicon germanium alloy layer 16L, a bottom spacer layer 18L, a sacrificial gate material layer 20L, a top spacer layer 22L and a dielectric material layer 24L that can be employed in the present application.

In the present application, the first semiconductor material layer 12L, the second semiconductor material layer 14L, the silicon germanium alloy layer 16L, the bottom spacer layer 18L, the sacrificial gate material layer 20L, the top spacer layer 22L and the dielectric material layer 24L are each contiguous (without voids or breaks) layers that are present atop the bulk semiconductor substrate 10. Collectively and for this embodiment, the bulk semiconductor substrate 10, the first semiconductor material layer 12L, and the second semiconductor material layer 14L may be referred to as a substrate.

The term "bulk semiconductor substrate" denotes a substrate that is entirely composed of at least one semiconductor material that has semiconducting properties; no insulator layers and/or conductive layers are present in the bulk semiconductor substrate 10. Illustrative examples of semiconductor materials that can be used in the present application as the bulk semiconductor substrate 10 include, but are not limited to, silicon (Si), germanium (Ge), silicon germanium alloys (SiGe), III-V compound semiconductors and/or II-VI compound semiconductors. III-V compound semiconductors include at least one element from Group III (i.e., Group 13) of the Periodic Table of Elements and at least one element from Group V (i.e., Group 15) of the Periodic Table of Elements, while II-VI compound semiconductors include at least one element from Group II (i.e., Group 2) of the Periodic Table of Elements and at least one element from Group VI (i.e., Group 16) of the Periodic Table of Elements). In one example, the bulk semiconductor substrate 10 may be entirely composed of single crystal silicon.

The first semiconductor material layer 12L of the first conductivity type that is present on a surface of the bulk semiconductor substrate 10 may include one of the semiconductor materials mentioned above for the bulk semiconductor substrate 10. In one embodiment of the present application, the first semiconductor material layer 12L comprises a same semiconductor material as the bulk semiconductor substrate 10. In another embodiment of the present application, the first semiconductor material layer 12L may comprise a different semiconductor material than the semiconductor material that provides the bulk semiconductor substrate 10.

As stated above, the first semiconductor material layer 12L is of the first conductivity type. That is, a p-type dopant or an n-type dopant is present in the first semiconductor material layer 12L. The term "p-type" refers to the addition of impurities to an intrinsic semiconductor that creates deficiencies of valence electrons. Examples of p-type dopants, i.e., impurities, include, but are not limited to, boron, aluminum, gallium and indium. "N-type" refers to the addition of impurities that contributes free electrons to an intrinsic semiconductor. Examples of n-type dopants, i.e., impurities, include, but are not limited to, antimony, arsenic and phosphorous. The concentration of dopant that provides the first conductivity type to the first semiconductor material layer 12L can range from 5e18 atoms/cm$^3$ to 1.5e21 atoms/cm$^3$.

The second semiconductor material layer 14L of the second conductivity type, which is present on a surface of the first semiconductor material layer 12L, may include one of the semiconductor materials mentioned above for the bulk semiconductor substrate 10; the second semiconductor material layer 14L must however have a different composition than the overlying silicon germanium alloy layer 16L. In one embodiment of the present application, the second semiconductor material layer 14L comprises a same semiconductor material as the bulk semiconductor substrate 10 as well as a same semiconductor material as the first semiconductor material layer 12L. In another embodiment of the present application, the second semiconductor material layer 14L may comprise a different semiconductor material than the semiconductor material that provides at least one of the bulk semiconductor substrate 10 and the first semiconductor material layer 12L. In one embodiment, each of the bulk semiconductor substrate 10, the first semiconductor material layer 12L and the second semiconductor material layer 14L is composed of single crystalline silicon.

As stated above, the second semiconductor material layer 14L is of the second conductivity type that differs from the first conductivity type. That is, a p-type dopant or an n-type dopant opposite to that present in the first semiconductor material is present in the second semiconductor material layer 14L. In one embodiment of the present application, the first semiconductor material layer 12L is composed of silicon that is doped with an n-type dopant such as, for example, phosphorous, while the second semiconductor material layer 14L is composed of silicon that is doped with an n-type dopant such as, for example, boron. The concentration of dopant that provides the second conductivity type to the second semiconductor material layer 14L can range from 5e18 atoms/cm$^3$ to 1.5e21 atoms/cm$^3$.

In one embodiment of the present application, a bulk semiconductor substrate 10 is first provided and then the first and second semiconductor material layers (12L, 14L) are epitaxially grown or deposited. The terms "epitaxial growth and/or deposition" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. In the present application, the first semiconductor material layer 12L can have same crystalline characteristic as the bulk semiconductor substrate 10, and the second semiconductor material layer 14L can have a same crystalline characteristic as both the first semiconductor material layer 12L and the bulk semiconductor substrate 10.

Examples of various epitaxial growth process apparatuses that are suitable for use in the present application may include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE) or metal-organic CVD (MOCVD). The temperature for epitaxial deposition process typically ranges from 250° C. to 900° C. Although higher temperature typically results in faster deposition, the faster deposition may result in crystal defects and film cracking. A number of different source gases may be used for the deposition of the first and second semiconductor material layers (12L, 14L). In some embodiments, the source gas for the deposition of the first and second semiconductor material layers (12L, 14L) may include a silicon containing gas source or a mixture of a silicon containing gas source and a germanium containing gas source. Carrier gases like hydrogen, nitrogen, helium and argon can be used. For either the first semiconductor material layer 12L or the second semiconductor material layer 14L, the dopant can be added during the epitaxial growth process or subsequent to the epitaxial growth process. When the dopant is added subsequent to the epitaxial growth process, the dopant may be introduced into the epitaxial deposited semiconductor material utilizing one or gas phase doping or ion implantation.

In some embodiments of the present application, a bulk semiconductor substrate 10 can be first provided and thereafter various techniques known to those skilled in the art such as, for example, ion implantation, may be used to introduce dopants within an upper portion of the bulk semiconductor substrate 10 and to provide the first and second semiconductor material layers (12L, 14L) described above.

The thicknesses of the first semiconductor material layer 12L and the second semiconductor material layer 14L that can be employed in the present application may vary and can range from 10 nm to 50 nm. Other thicknesses that are lesser than 10 nm and greater than 50 nm can also be employed as the thickness of the first and second semiconductor material layers (12L, 14L).

In the illustrated embodiment of the present application, the first semiconductor material layer 12L may serve as a well region, while the second semiconductor material layer 14L may serve as an etch stop layer.

Silicon germanium alloy layer 16L is present on the second semiconductor material layer 14L. The silicon germanium alloy layer 16L may contain a germanium content from 15 atomic percent germanium to 75 atomic percent germanium; other germanium contents are possible and are not excluded from being used in the present application. In some embodiments of the present application, the silicon germanium alloy layer 16L can be formed on the surface of the second semiconductor material layer 14L utilizing an epitaxial growth process as mentioned above. In other embodiments, the silicon germanium alloy layer 16L can be formed on the surface of the second semiconductor material layer 14L utilizing a wafer bonding process.

The thickness of the silicon germanium alloy layer 16L is typically below the critical thickness in which defects form in the silicon germanium alloy layer 16L. In one embodiment of the present application, the thickness of the silicon germanium alloy layer 16L can be from 20 nm to 100 nm. Other thicknesses that are lesser than 20 nm and greater than 100 nm can also be employed as the thickness of the silicon germanium alloy layer 16L as long as the selected thickness is less than the critical thickness of a particular silicon germanium alloy.

Bottom spacer layer 18L is then provided on a surface of the silicon germanium alloy layer 16L. The bottom spacer layer 16L may include any dielectric spacer material such as, for example, silicon dioxide, silicon nitride or silicon oxynitride. In some embodiments, a single dielectric spacer material can be used in providing the bottom spacer layer 18L. In other embodiments, a multilayered stack of at least two different dielectric spacer materials can be used in providing the bottom spacer layer 18L. The bottom spacer layer 18L can be formed utilizing a conventional deposition process such as, for example, chemical vapor deposition or plasma enhanced chemical vapor deposition. The bottom spacer layer 18L can have a thickness from 10 nm to 50 nm. Other thicknesses that are lesser than 10 nm and greater than 50 nm can also be employed as the thickness of the bottom spacer layer 18L.

Sacrificial gate material layer 20L is then provided on a surface of the bottom spacer layer 18L. The sacrificial gate material layer 20L includes any material having a different etch rate than at least the bottom spacer layer 18L such as, for example, amorphous polysilicon. The sacrificial gate material layer 20L can be formed utilizing a deposition process such as, for example, chemical vapor deposition, plasma enhanced chemical vapor deposition, physical vapor deposition, or sputtering. In one embodiment of the present application, the thickness of the sacrificial gate material layer 20L can be from 50 nm to 500 nm. Other thicknesses that are lesser than 50 nm and greater than 500 nm can also be employed as the thickness of the sacrificial gate material layer 20L.

Top spacer layer 22L is then provided on a surface of the sacrificial gate material layer 20L. Top spacer layer 22L may include one of the dielectric spacers mentioned above for the bottom spacer layer 18L. In one embodiment of the present application, the top spacer layer 22L is composed of a same dielectric spacer material as the bottom spacer layer 18L. In another embodiment of the present application, the top spacer layer 22L is composed of a spacer dielectric material that is different from a spacer dielectric material that provides the bottom spacer layer 18L. The top spacer layer 22L can be formed utilizing one of the deposition processes mentioned above in providing the bottom spacer layer 18L. The top spacer layer 22L may have a thickness within the range mentioned above for the bottom spacer layer 18L.

Dielectric material layer 24L is formed on a surface of the top spacer layer 22L. Dielectric material layer 24L is composed of a dielectric material that differs from the dielectric spacer material that provides the top spacer layer 22L. In one embodiment, and when the top spacer layer 22L is composed of silicon nitride, the dielectric material layer 24L is composed of an oxide such as, for example, silicon dioxide. The dielectric material layer 24L can be formed utilizing a deposition process such as, for example, chemical vapor deposition or plasma enhanced chemical vapor deposition. In one embodiment of the present application, the thickness of the dielectric material layer 24L can be from 50 nm to 500 nm. Other thicknesses that are lesser than 50 nm and greater than 500 nm can also be employed as the thickness of the dielectric material layer 24L.

Figure 2:
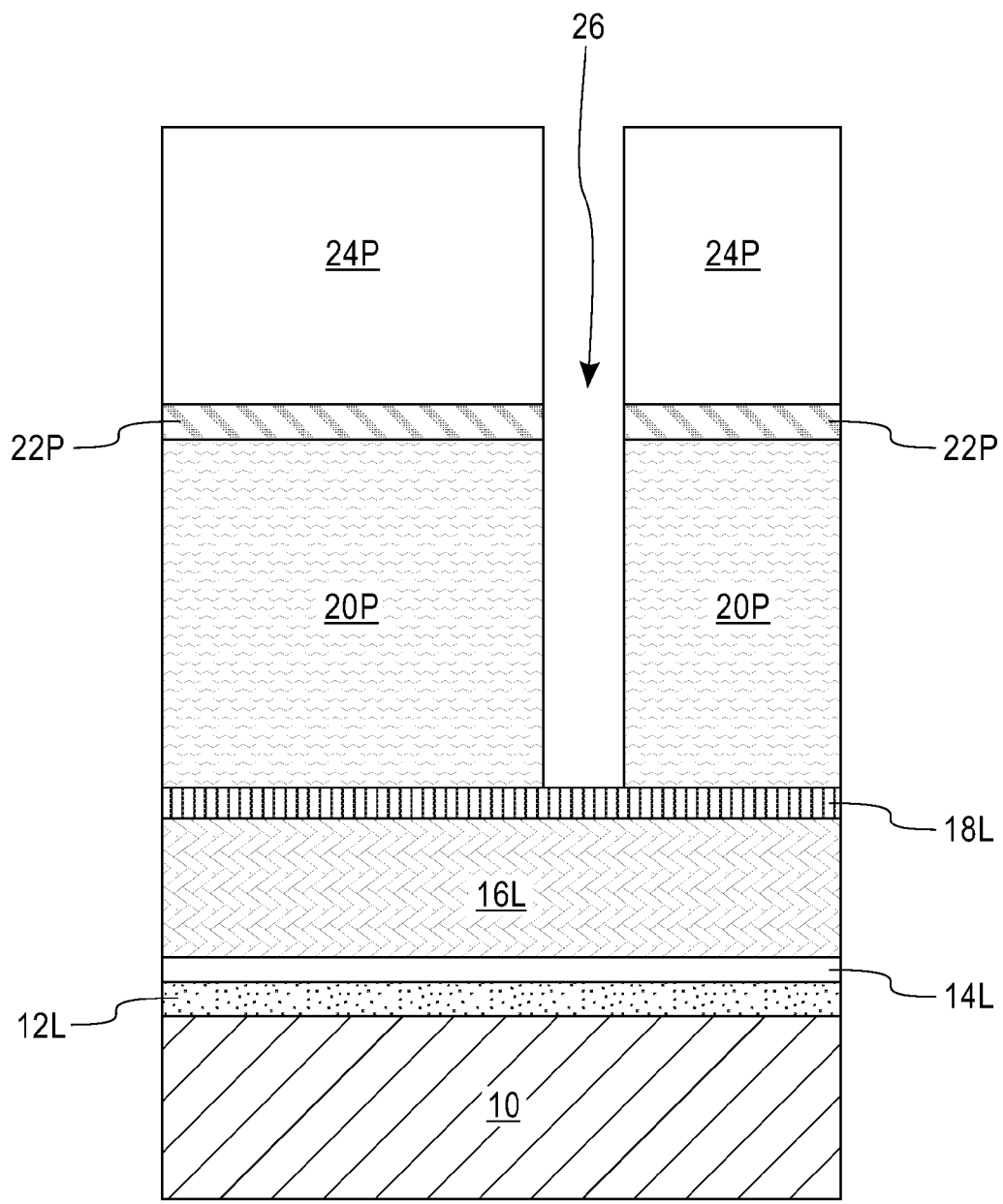
FIG. 2 is a cross sectional view of the exemplary semiconductor structure of FIG. 1 after forming an opening within the material stack that exposes a surface of the bottom spacer layer.

Referring now to FIG. 2, there is illustrated the exemplary semiconductor structure of FIG. 1 after forming an opening 26 within the material stack shown in FIG. 1 that exposes a surface of the bottom spacer 18L. Thus, the opening 26 extends entirely through the dielectric material layer 24L, the top spacer layer 22L, and the sacrificial gate material layer 20L. The opening 26 has vertical sidewalls relative to the topmost surface of the underlying bulk semiconductor substrate 10. The opening 26 can be performed utilizing an anisotropic etching process such as, for example, reactive ion etching or plasma etching. The width of the opening 26 can be from 10 nm to 50 nm; although other widths for the opening 26 are possible and are not excluded from being used in the present application. Although a single opening 26 is described and illustrated, a plurality of openings 26 can be formed into different portions of the material stack shown in FIG. 1.

After forming opening 26 into the material stack shown in FIG. 1, portions of the dielectric material layer 24L, portions of the top spacer layer 22L and portions of the sacrificial gate material layer 20L remain. Each remaining portion of the dielectric material layer 24L may be referred to herein as a dielectric material portion 24P, each remaining portion of the top spacer layer 22L may be referred to herein as a top spacer portion 22P, and each remaining portion of the sacrificial gate material layer 20L may be referred to herein as a sacrificial gate material portion 20P.

Figure 3:
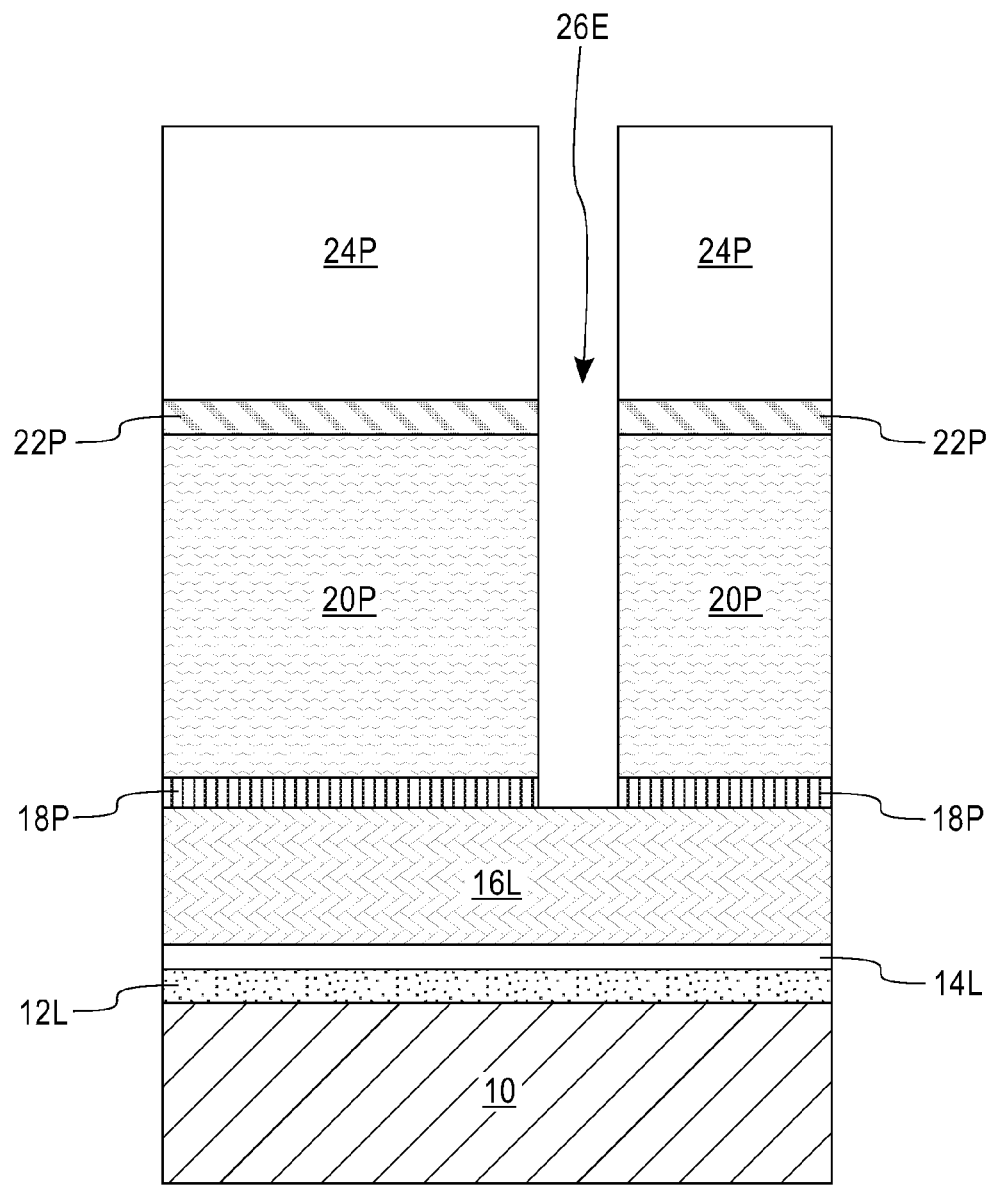
FIG. 3 is a cross sectional view of the exemplary semiconductor structure of FIG. 2 after extending the length of the opening to expose a surface of the silicon germanium alloy layer.

Referring now to FIG. 3, there is illustrated the exemplary semiconductor structure of FIG. 2 after extending the length of the opening 26 to provide an extended opening 26E that exposes a surface of the silicon germanium alloy layer 16L. In this step of the present application, the bottom spacer layer 18L is etched and each remaining portion of the bottom spacer layer 18L may be referred to here as a bottom spacer 18P. In some embodiments, extended opening 26E can be formed utilizing the same anisotropic etch that provides opening 26. In other embodiments, the extended opening 26E can be formed utilizing a different anisotropic etch than that used in providing opening 26. Like opening 26, extended opening 26E has vertical sidewalls.

Figure 4:
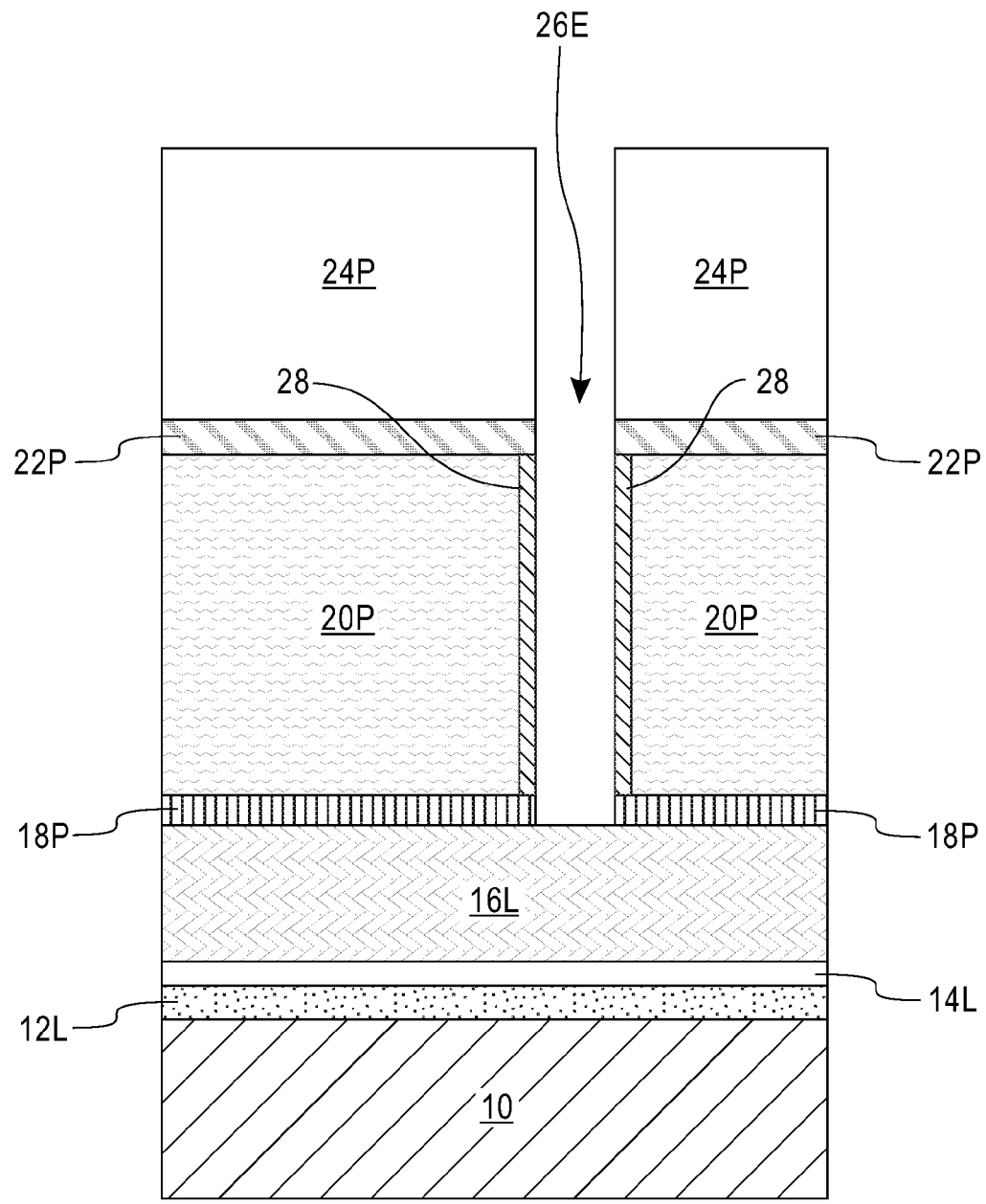
FIG. 4 is a cross sectional view of the exemplary semiconductor structure of FIG. 3 after forming a protective oxide on sidewall surfaces of the sacrificial gate material layer.

Referring now to FIG. 4, there is illustrated the exemplary semiconductor structure of FIG. 3 after forming a protective oxide 28 on sidewall surfaces of the sacrificial gate material portions 20P. In some embodiments and as shown in FIG. 4, the protective oxide 28 is formed entirely into the outer exposed sidewalls of each sacrificial gate material portion 20P. In such an embodiment, each protective oxide 28 has a sidewall that is vertical aligned to the sidewall surfaces of the other material layers within extended opening 26E.

Each protective oxide 28 can be formed utilizing a plasma oxidation process. Other oxidation processes besides plasma oxidation can also be used in providing each protective oxide 28.

Figure 5:
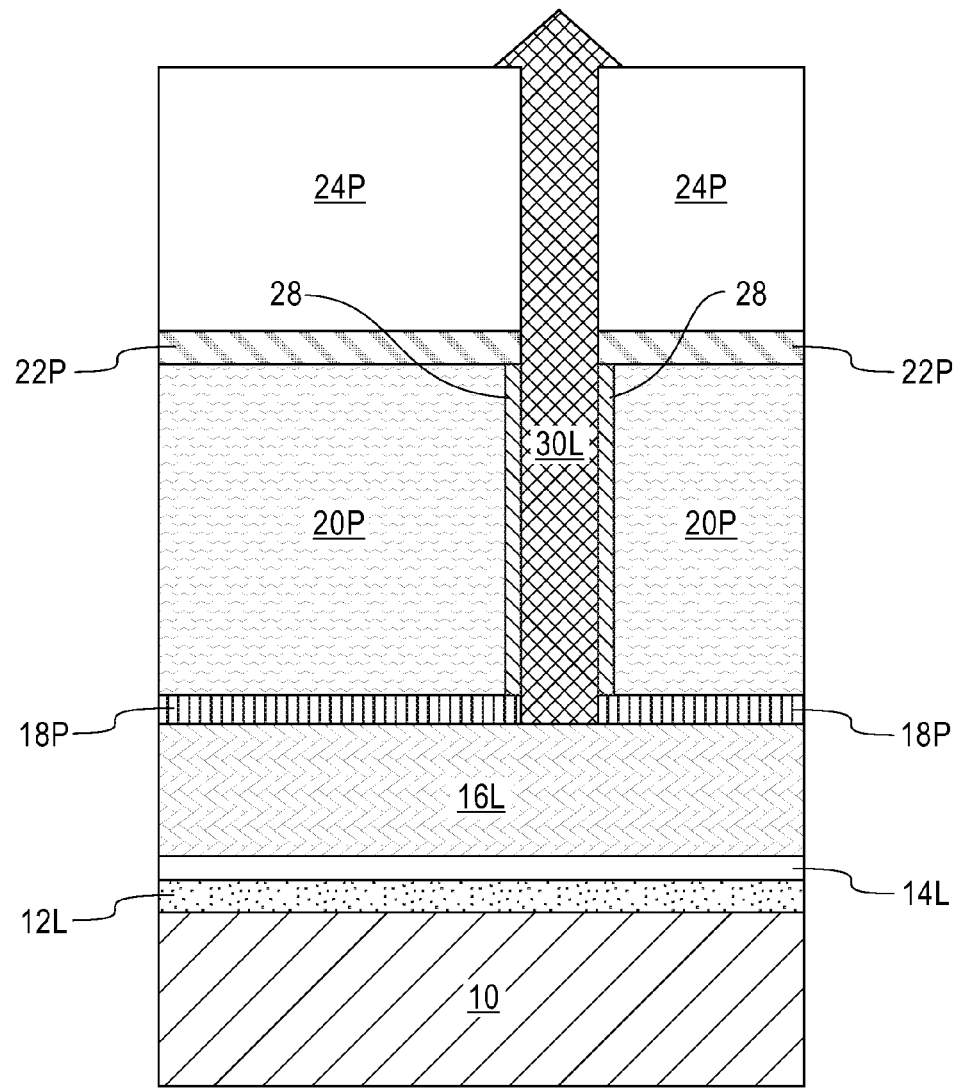
FIG. 5 is a cross sectional view of the exemplary semiconductor structure of FIG. 4 after epitaxially growing a semiconductor channel material from the exposed surface of the silicon germanium alloy layer.

Referring now to FIG. 5, there is illustrated the exemplary semiconductor structure of FIG. 4 after epitaxially growing a semiconductor channel material 30L from the exposed surface of the silicon germanium alloy layer 16L and within extended opening 26E. The semiconductor channel material 30L can be formed utilizing an epitaxial growth process as defined above. The semiconductor channel material 30L may include any semiconductor material including, for example, silicon, germanium or a III-V compound semiconductor material, provided that the semiconductor material that provides the semiconductor channel material 30L is different in composition from the silicon germanium alloy layer 16L; hence the semiconductor channel material 30L has a different etch rate than the silicon germanium alloy layer 16L. The semiconductor channel material 30L completely fills the extended opening 26E and extends above and outside of the mouth of the extended opening 26E.

Figure 6:
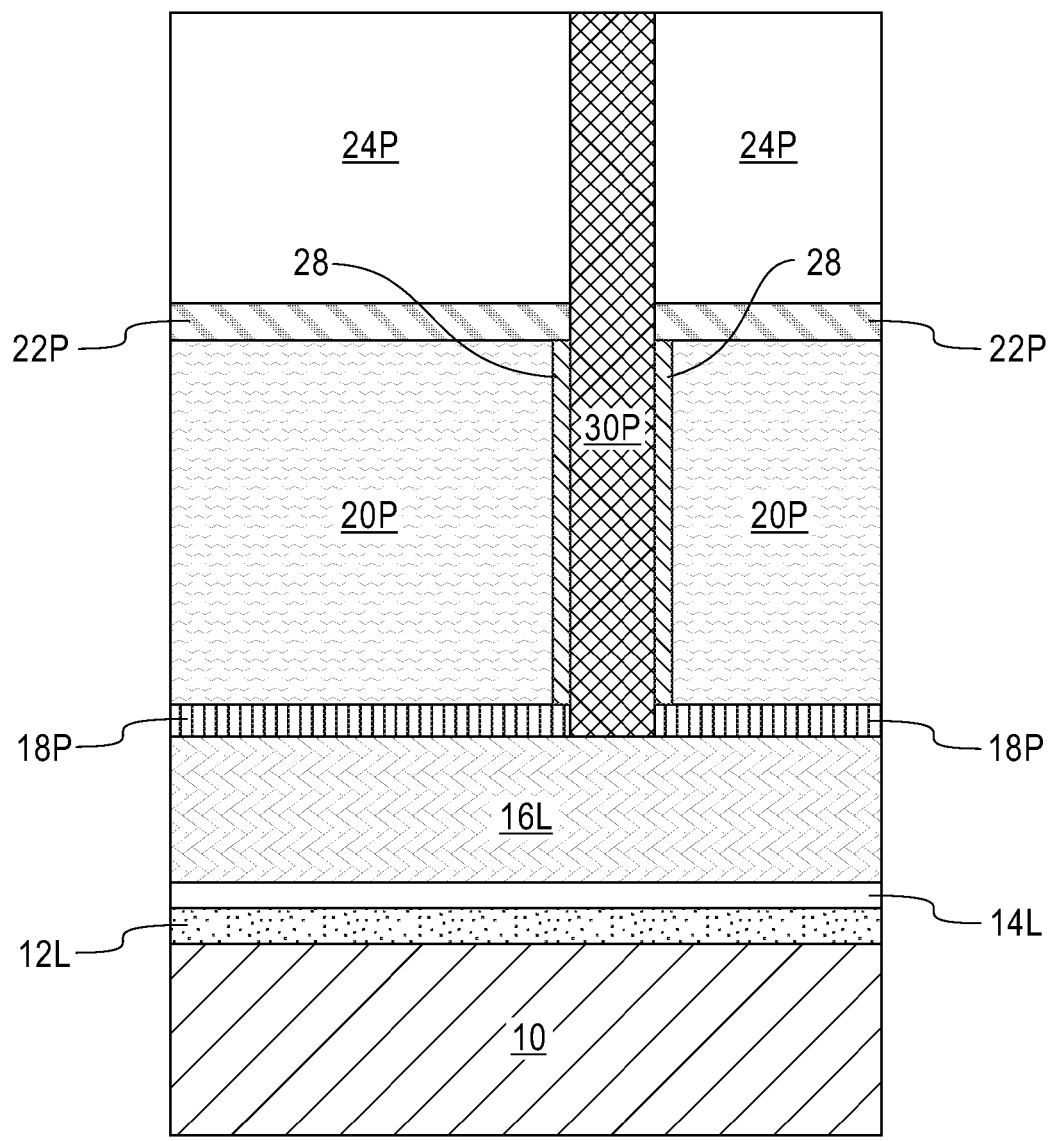
FIG. 6 is a cross sectional view of the exemplary semiconductor structure of FIG. 5 after performing a planarization process.

Referring now to FIG. 6, there is illustrated the exemplary semiconductor structure of FIG. 5 after performing a planarization process such as, for example, chemical mechanical planarization (CMP) and/or grinding. The planarization process removes excess semiconductor channel material 30L that extends above and outside of the mouth of the extended opening 26E, while leaving a portion of the semiconductor channel material 30L in the extended opening 26E. The portion of the semiconductor channel material 30L that remains in the extended opening 24E may be referred to as a semiconductor channel material portion 30P. Semiconductor channel material portion 30P extends vertically upwards from the exposed surface of the silicon germanium alloy layer 16L and has a topmost surface that is, at this point of the present application, coplanar with a topmost surface of each dielectric material portion 24P.

Figure 7:
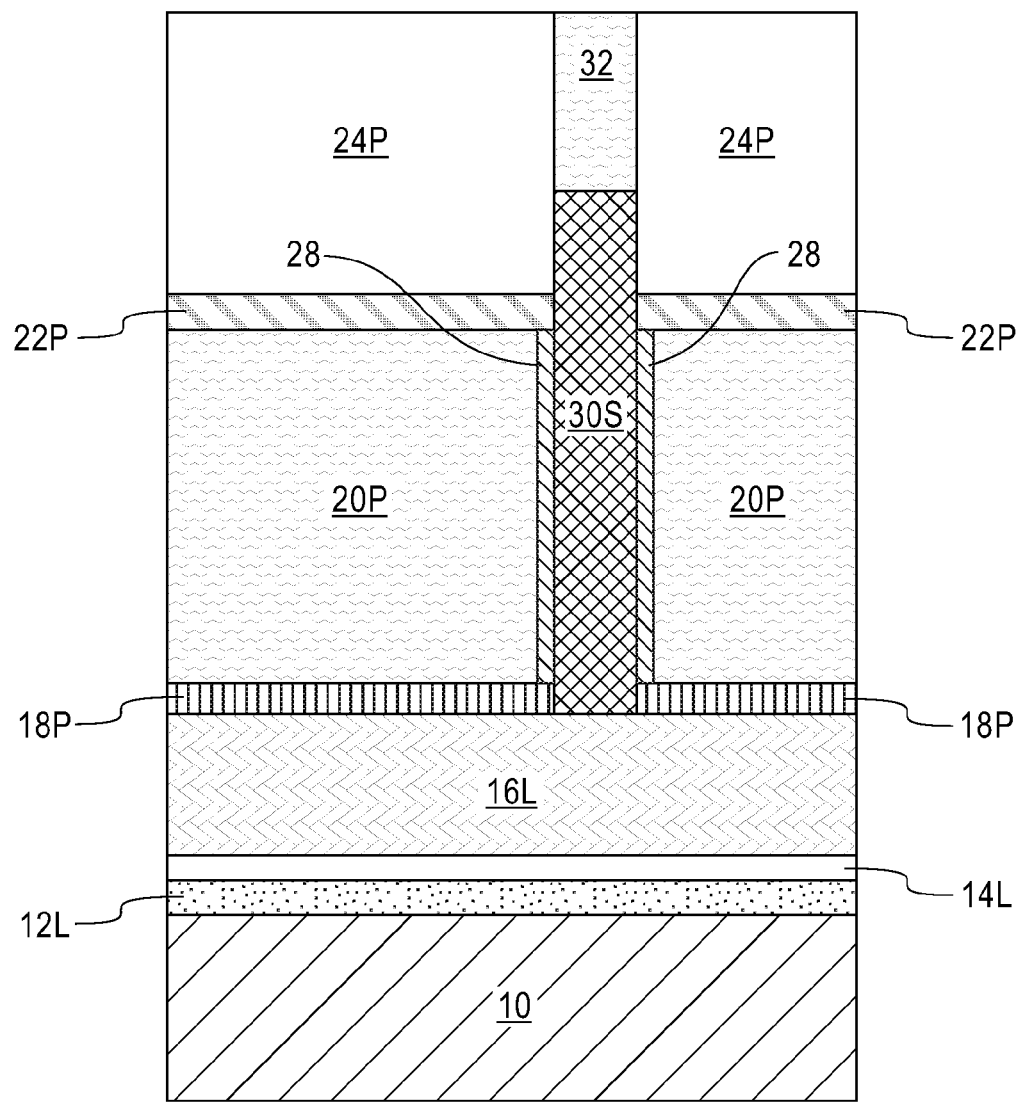
FIG. 7 is a cross sectional view of the exemplary semiconductor structure of FIG. 6 after recessing the semiconductor channel material and forming a dielectric cap on a remaining portion of the semiconductor channel material.

Referring now to FIG. 7, there is illustrated the exemplary semiconductor structure of FIG. 6 after recessing the semiconductor channel material portion 30P and forming a dielectric cap 32 on a remaining portion of the semiconductor channel material portion 30P. The remaining semiconductor channel material portion 30P within the extended opening 26E after recessing may be referred to herein as a semiconductor channel material structure 30S. The semiconductor channel material structure 30S has a topmost surface that is located between the topmost and bottommost surfaces of each dielectric material portion 24P.

The recessing used to provide the semiconductor channel structure 30S may include an etch back process in which a chemical etchant that is selective in removing the semiconductor channel material is used.

The dielectric cap 32 can include any dielectric material provided that it differs in composition from the dielectric material that provides each dielectric material portion 24P. In one example, the dielectric cap 32 may be composed of a silicon nitride, while each dielectric material portion 24P may be composed of silicon dioxide. The dielectric cap 32 can be formed by a deposition process such as, for example, chemical vapor deposition, followed by a planarization process. As is shown, the dielectric cap 32 at this point of the present application has a topmost surface that is coplanar with a topmost surface of each dielectric material portion 24P.

Figure 8:
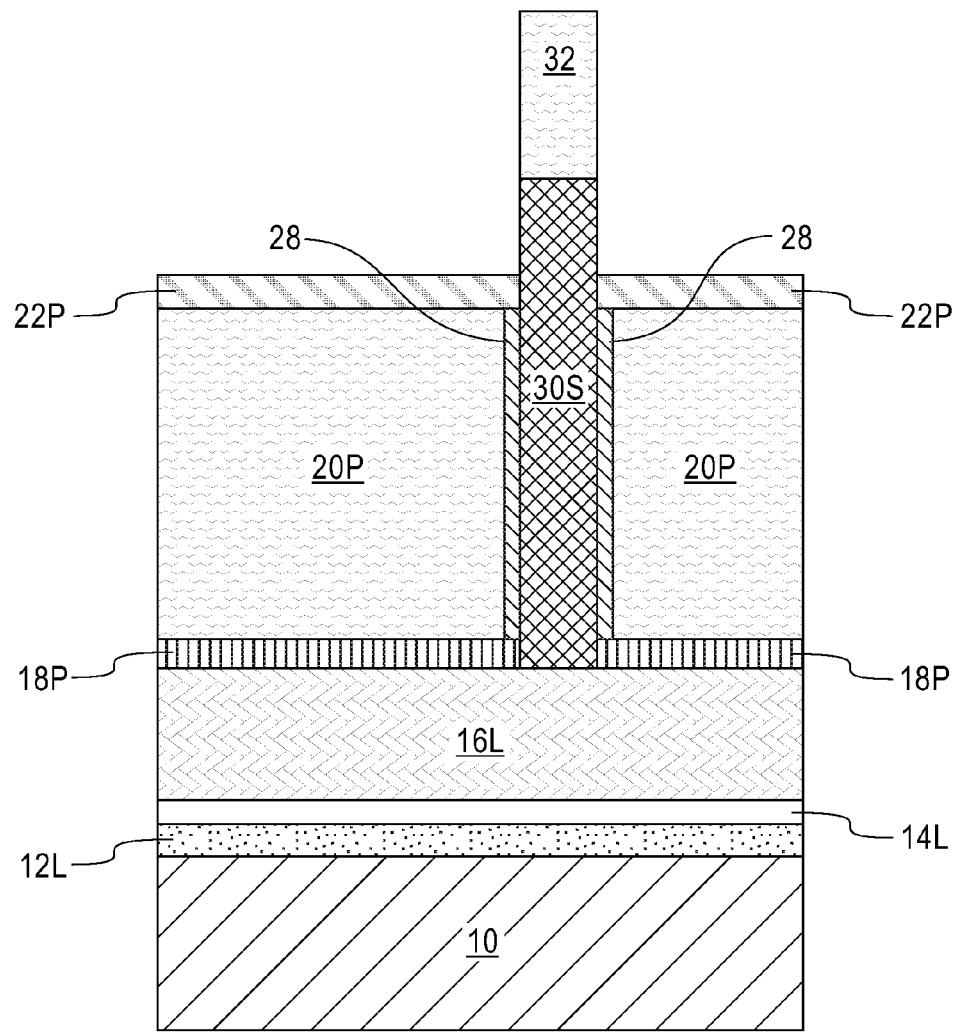
FIG. 8 is a cross sectional view of the exemplary semiconductor structure of FIG. 7 after removing the dielectric material layer.

Referring now to FIG. 8, there is illustrated the exemplary semiconductor structure of FIG. 7 after removing each dielectric material portion 24P, stopping on a topmost surface of each top spacer portion 22P. The removal of each dielectric material portion 24P exposes the sidewall surfaces of an upper portion of the semiconductor channel material structure 30S as well exposing the sidewall surfaces and topmost surface of the dielectric cap 32.

The removal of each dielectric material portion 24P is performed utilizing an etch that is selective in removing the dielectric material that provides each dielectric material portion 24P. In one embodiment, and when each dielectric material portion 24P is composed of silicon dioxide, hydrofluoric acid, or a buffered oxide etch (i.e., a mixture of ammonium fluoride and hydrofluoric acid) can be used.

Figure 9:
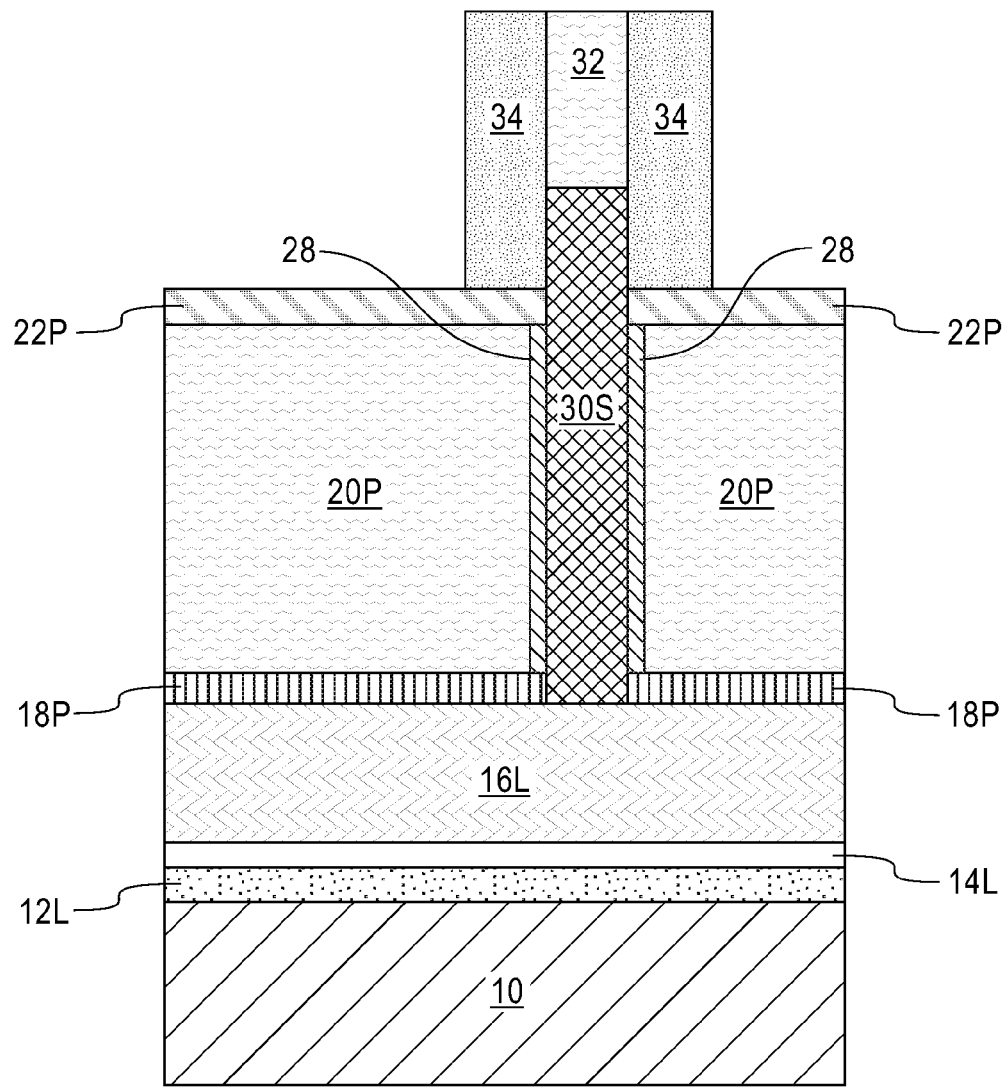
FIG. 9 is a cross sectional view of the exemplary semiconductor structure of FIG. 8 after forming a vertical sidewall spacer on at least exposed sidewall surfaces of an upper portion of the remaining portion of the semiconductor channel material.

Referring now to FIG. 9, there is illustrated the exemplary semiconductor structure of FIG. 8 after forming a vertical sidewall spacer 34 on at least exposed sidewall surfaces of the upper portion of the semiconductor channel material structure 30S. The vertical sidewall spacer 34 may also be formed on the exposed sidewall surfaces of the dielectric cap 32. The vertical sidewall spacer 34 may include one of the dielectric spacer materials mentioned above for the top and bottom spacer layers. The vertical sidewall spacer 34 may be composed of a same or different dielectric spacer material than that which provides the top and bottom spacer layers (18L, 22L). The vertical sidewall spacer 34 may be formed utilizing a deposition process, followed by a spacer etch such as, for example, a reactive ion etch.

Figure 10:
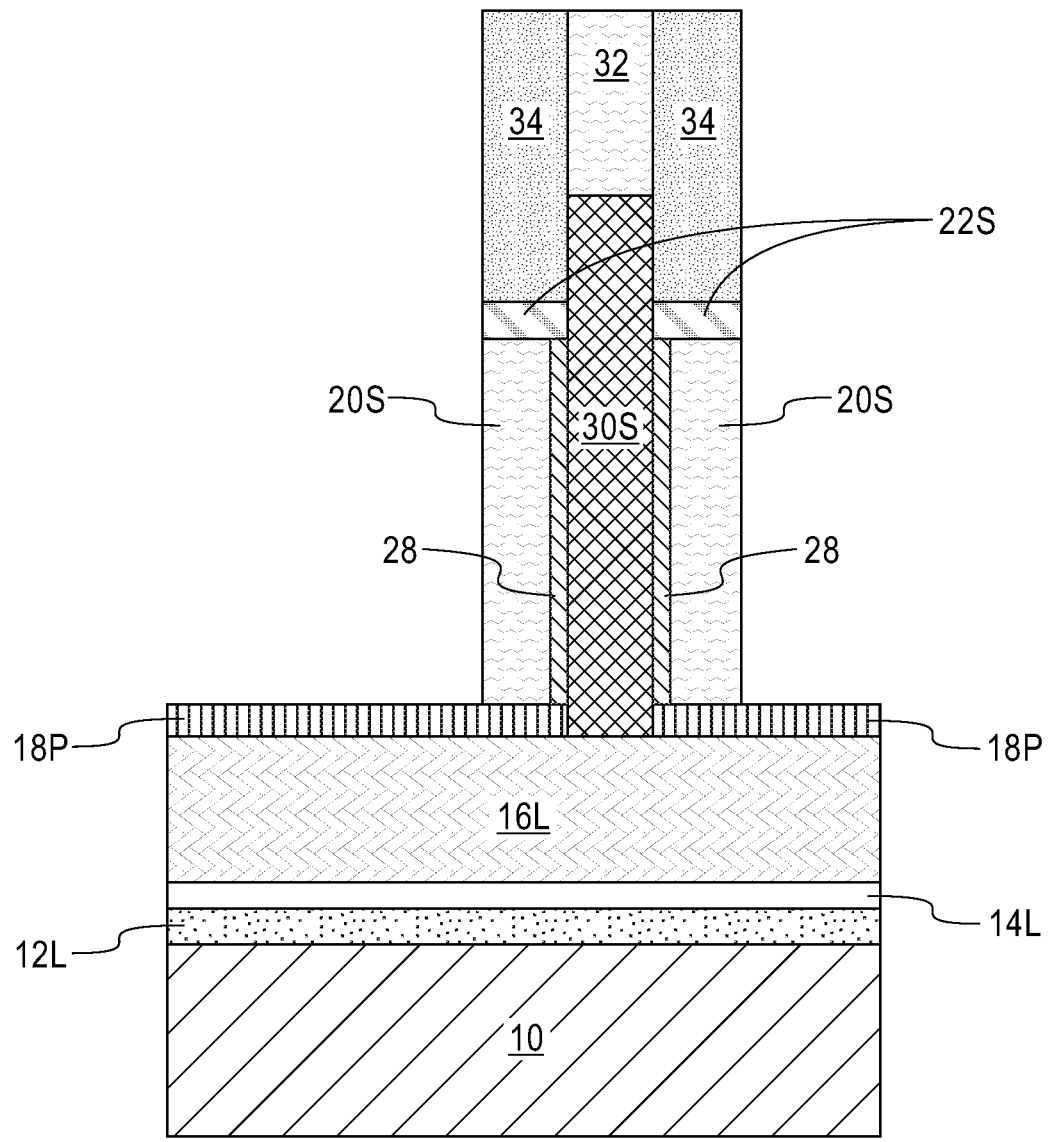
FIG. 10 is a cross sectional view of the exemplary semiconductor structure of FIG. 9 after removing exposed portions of the top spacer layer and underlying portions of the sacrificial gate material layer.

Referring now to FIG. 10, there is illustrated the exemplary semiconductor structure of FIG. 9 after removing exposed portions of each top spacer portion 22P and underlying portions of each sacrificial gate material portion 20P. The removal performed in this step of the present application utilizes the vertical sidewall spacer 34 and the dielectric cap 32 as an etch mask. The removal may be performed utilizing at least one anisotropic etching process. After performing the etch, portions of each top spacer portion 22P and portions of each sacrificial gate material portion 20P remain. Each remaining portion of each top spacer portion 22P can be referred to as a top spacer 22S, while each remaining portion of each sacrificial gate material portion 20P may be referred to here as a sacrificial gate material spacer portion 20S. As is shown in FIG. 10, the etch exposes a topmost surface of each bottom spacer 18P.

Figure 11:
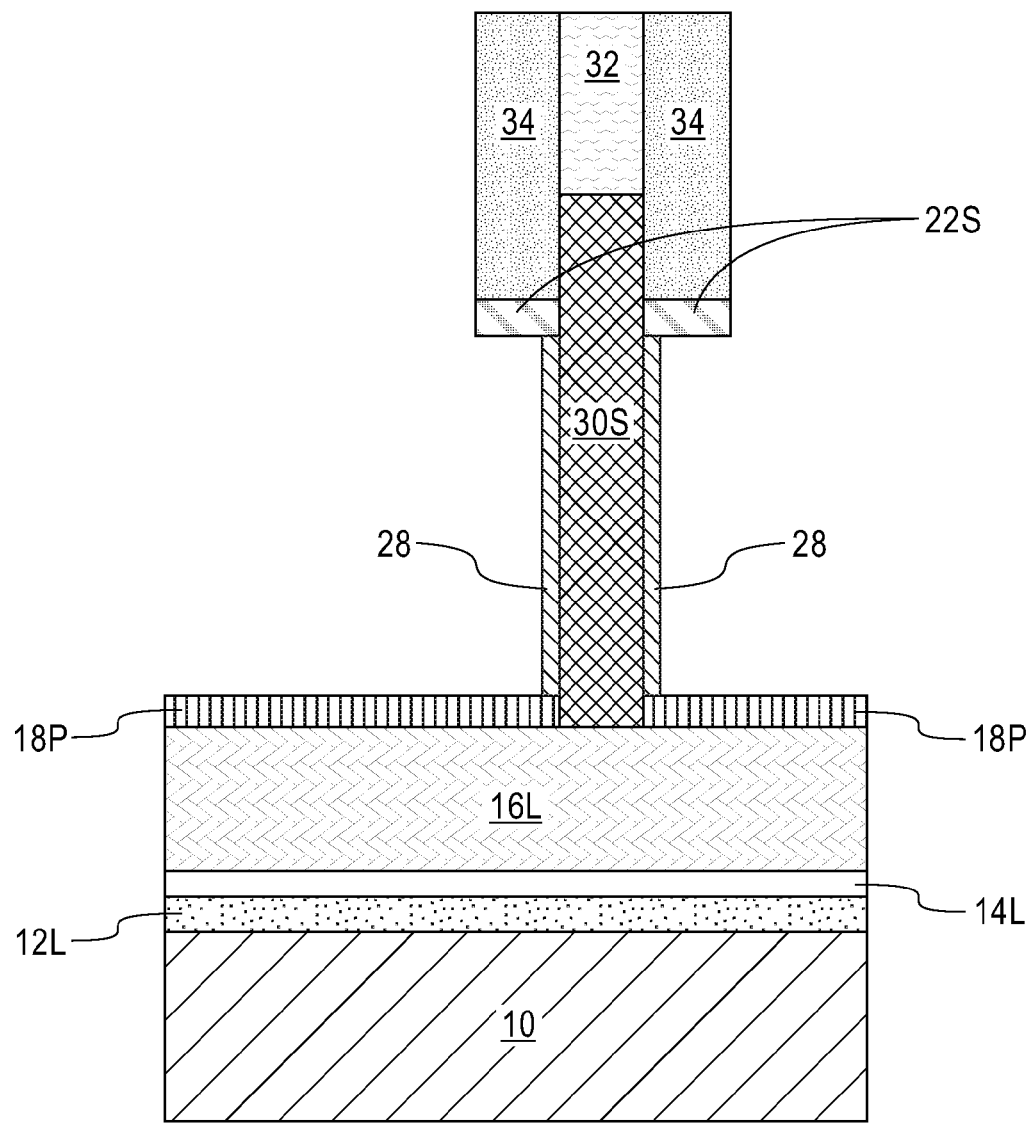
FIG. 11 is a cross sectional view of the exemplary semiconductor structure of FIG. 10 after removing the remaining portions of the sacrificial gate material layer.

Referring now to FIG. 11, there is illustrated the exemplary semiconductor structure of FIG. 10 after removing each sacrificial gate material spacer portion 20S. Each sacrificial gate material spacer portion 20S can be removed utilizing an etch that is selective in removing the material that provides each sacrificial gate material spacer portion 20S. In one example, and when each sacrificial gate material spacer portion 20S is composed of amorphous silicon, reactive ion etching (RIE) can be used. This step of the present application exposes sidewall surfaces of the protective oxide 28 that is located on portions of the semiconductor channel material structure 30S.

Figure 12:
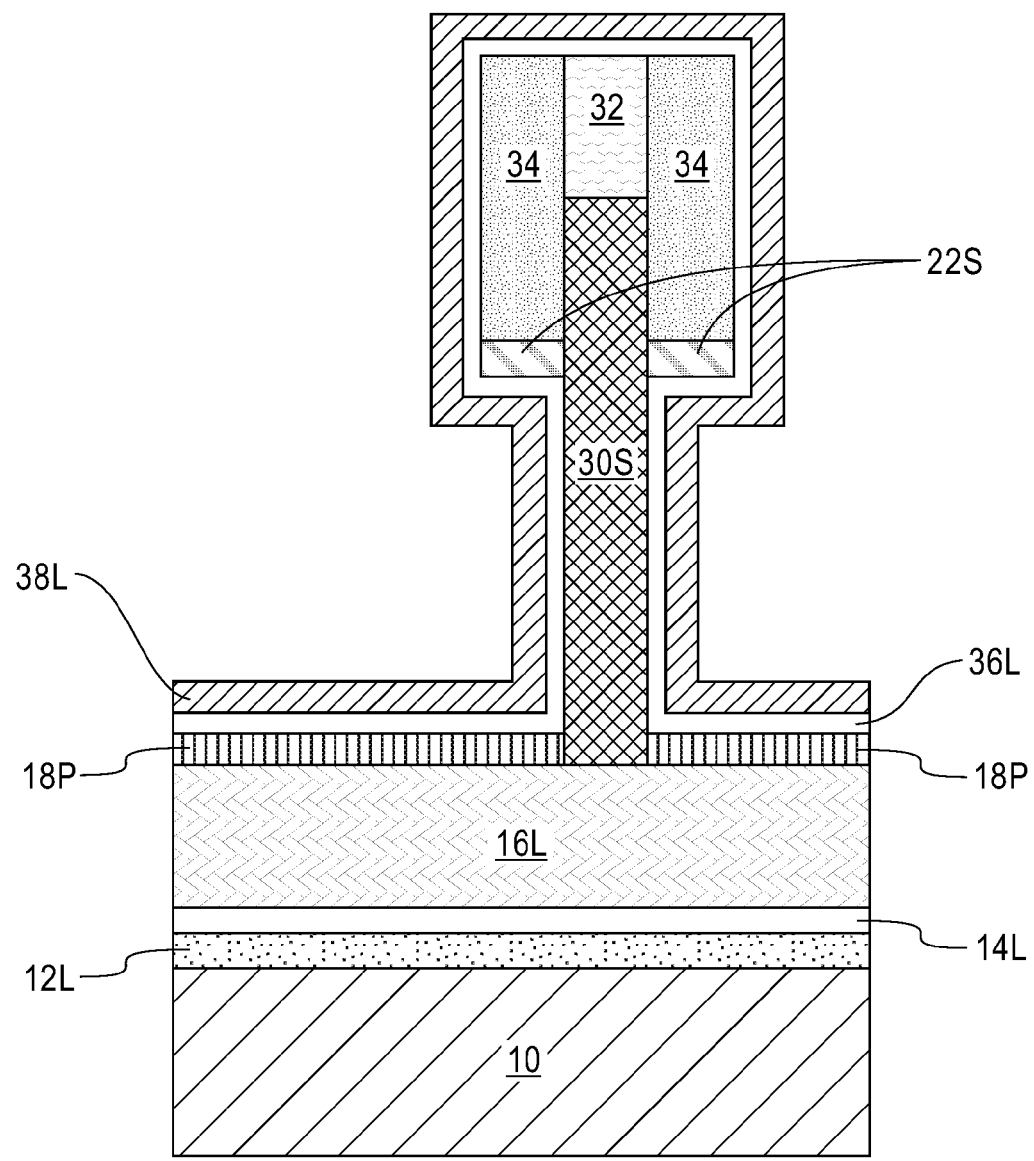
FIG. 12 is a cross sectional view of the exemplary semiconductor structure of FIG. 11 after forming a gate material stack of a gate dielectric material and a work functional metal.

Referring now to FIG. 12, there is illustrated the exemplary semiconductor structure of FIG. 11 after removing the protective oxide 28 and forming a gate material stack (36L, 38L) of a gate dielectric material 36L and a work function metal 38L. The protective oxide 28 can be removed utilizing an etch that is selective in removing the protective oxide 28. When the protective oxide 28 is composed of silicon dioxide, hydrofluoric acid or a buffered oxide etch (as defined above) can be used. The removal of the protective oxide 28 exposes portions of the sidewall surfaces of the semiconductor channel material structure 30S such that portions of the gate structure, i.e., the gate dielectric material 36L, come into direct physical contact with the exposed sidewall surfaces of the semiconductor channel material structure 30S.

The gate dielectric material 36L of the gate stack is composed of a gate dielectric material. The gate dielectric material that provides the gate dielectric material 36L can be an oxide, nitride, and/or oxynitride. In one example, the gate dielectric material that provides the gate dielectric material 36L can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multi-layered gate dielectric structure comprising different gate dielectric materials, e.g., silicon dioxide, and a high-k gate dielectric can be formed and used as the gate dielectric material 36L.

The gate dielectric material used in providing the gate dielectric material 36L can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material used in providing the gate dielectric material 36L can have a thickness in a range from 1 nm to 10 nm. Other thicknesses that are lesser than, or greater than, the aforementioned thickness range can also be employed for the gate dielectric material 36L.

In one embodiment of the present application, the work function metal 38L of the gate stack is composed of an n-type work function metal. As used herein, an "n-type work function metal" is a metal that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal ranges from 4.1 eV to 4.3 eV. In one embodiment, the n-type work function metal is composed of at least one of TiAl, TaN, TiN, HfN, HfSi, or combinations thereof. The n-type work function metal can be formed using chemical vapor deposition atomic layer deposition, sputtering or plating.

In another embodiment, the work function metal 38L of the gate stack may be a p-type work function metal. As used herein, a "p-type work function metal" is a metal that effectuates a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. In one embodiment, the p-type work function metal may be composed of titanium, titanium nitride or titanium carbide. The p-type work function metal may also be composed of TiAlN, Ru, Pt, Mo, Co and alloys and combinations thereof. In one embodiment, the p-type work function metal can be formed by, a physical vapor deposition method, such as sputtering, chemical vapor deposition or atomic layer deposition.

In one embodiment of the present application, the work function metal 38L can have a thickness in a range from 1 nm to 10 nm. Other thicknesses that are lesser than, or greater than, the aforementioned thickness range can also be employed for the used in providing the work function metal 38L.

Figure 13:
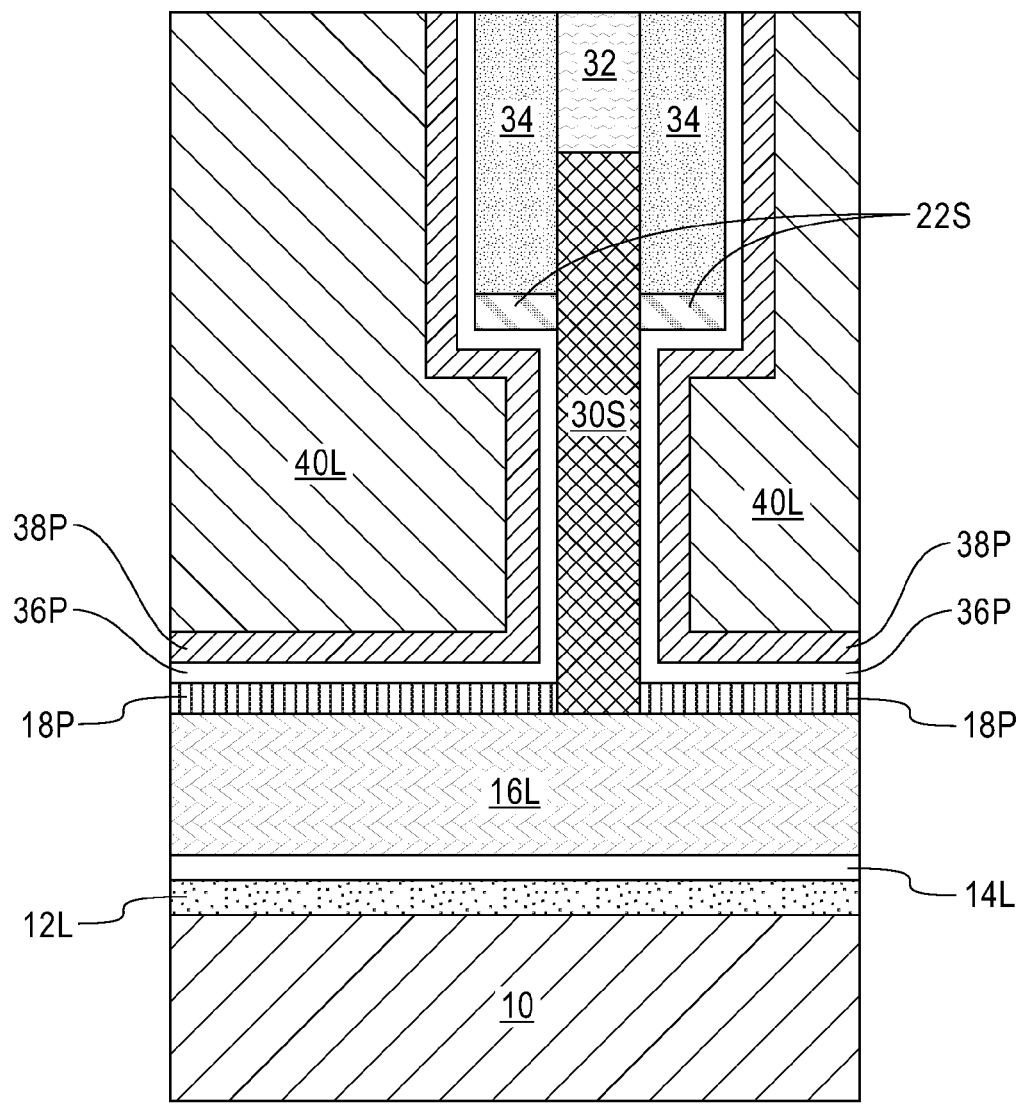
FIG. 13 is a cross sectional view of the exemplary semiconductor structure of FIG. 12 after forming a gate conductor material.

Referring now to FIG. 13, there is illustrated the exemplary semiconductor structure of FIG. 12 after forming a gate conductor material 40L and performing a planarization process. As is shown the gate conductor material 40L comes into direct contact with a surface of the work function metal 38L. The gate conductor material 40L can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. The gate conductor material 40L can be formed utilizing a deposition process including, for example, chemical vapor deposition plasma enhanced chemical vapor deposition, physical vapor deposition, sputtering, atomic layer deposition or other like deposition processes. When a metal silicide is formed, a conventional silicidation process is employed. In one embodiment, the gate conductor material 40L has a thickness from 1 nm to 100 nm. Other thicknesses that are lesser than, or greater than, the aforementioned thickness range can also be employed for the gate conductor material 40L.

The planarization process removes material located atop the vertical sidewall spacer 34 and the dielectric cap 32 providing the structure shown in FIG. 13. Notably, the planarization process removes portions of the gate conductor material 40L, portions of the work function metal 38L and portions of the gate dielectric material 36L present atop the vertical sidewall spacer 34 and the dielectric cap 32. In the drawing, element 36P denotes a gate dielectric material portion that remains after the planarization, while element 38P denotes a work function metal portion that remains after the planarization.

Figure 14:
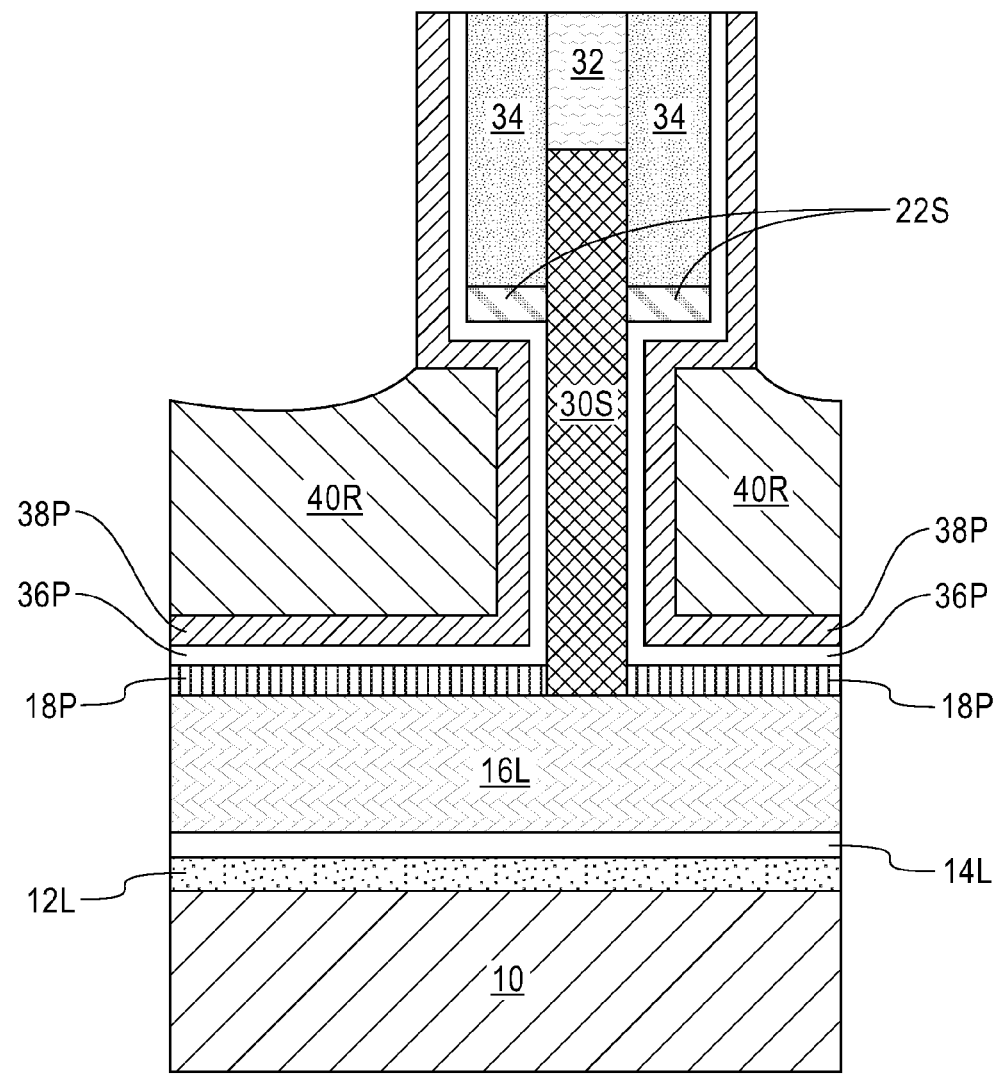
FIG. 14 is a cross sectional view of the exemplary semiconductor structure of FIG. 13 after recessing the gate conductor material.

Referring now to FIG. 14, there is illustrated the exemplary semiconductor structure of FIG. 13 after recessing the gate conductor material 40L providing recessed gate conductor material portions 40R on each side of the semiconductor channel material structure 30S. The recessing of the gate conductor material 40L that provides the recessed gate conductor material portions 40R may be performed utilizing an etch that is selective in removing the conductor gate material. As is shown in FIG. 14, the recess exposes portions of each work function metal portion 38P.

Figure 15:
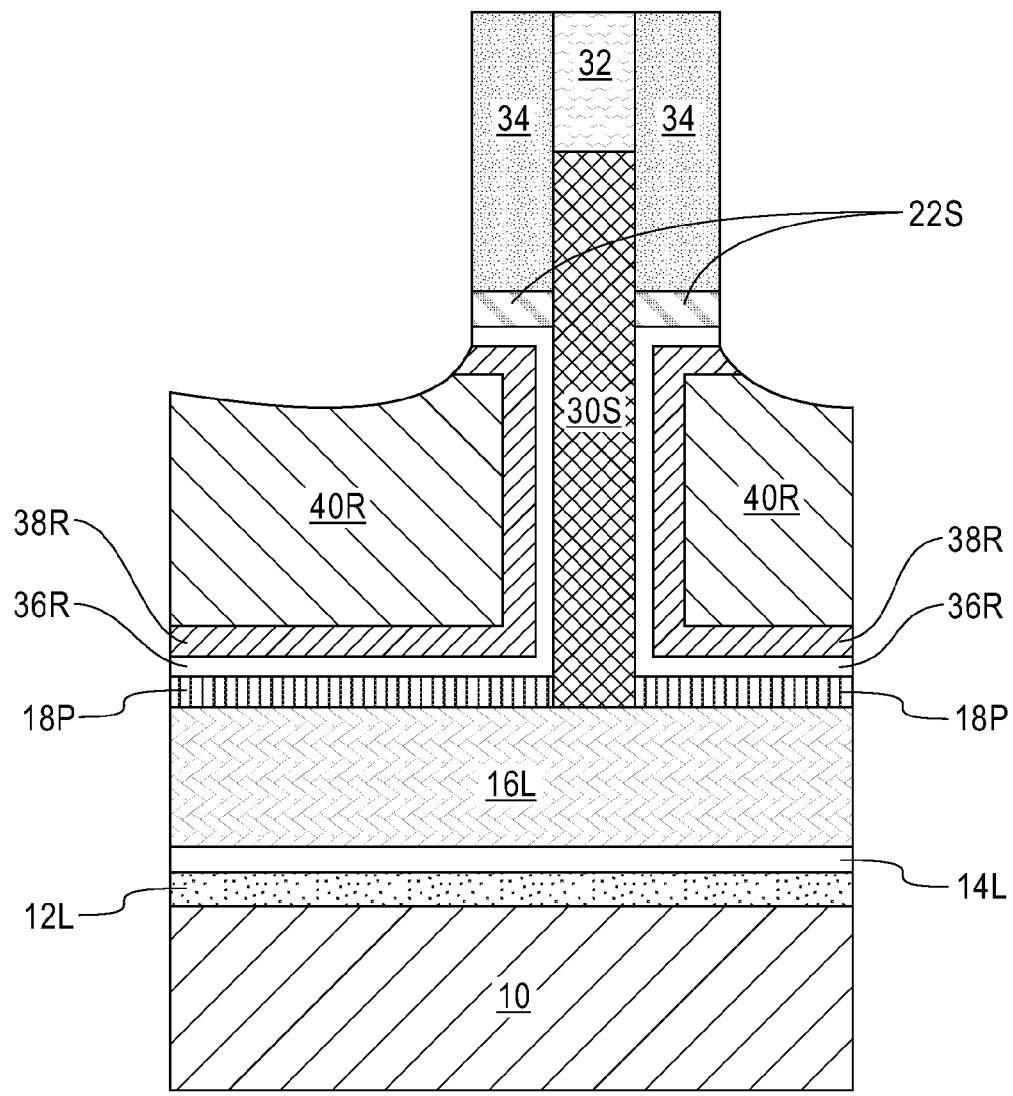
FIG. 15 is a cross sectional view of the exemplary semiconductor structure of FIG. 14 after removing exposed portions of the gate material stack.

Referring now to FIG. 15, there is illustrated the exemplary semiconductor structure of FIG. 14 after removing exposed portions of the gate material stack, i.e. removing exposed portions of the work function metal portion 38P and underlying portions of the gate dielectric material portion 36P, not protected by each recessed gate conductor material portion 40R. In the drawing, element 38R denotes portions of the work function metal and element 36R denotes portions of the gate dielectric material that remain in the structure. The removal of the exposed portions of the gate material stack can be performed utilizing one or more etch processes that are capable of removing the exposed portions of the gate material stack.

Figure 16:
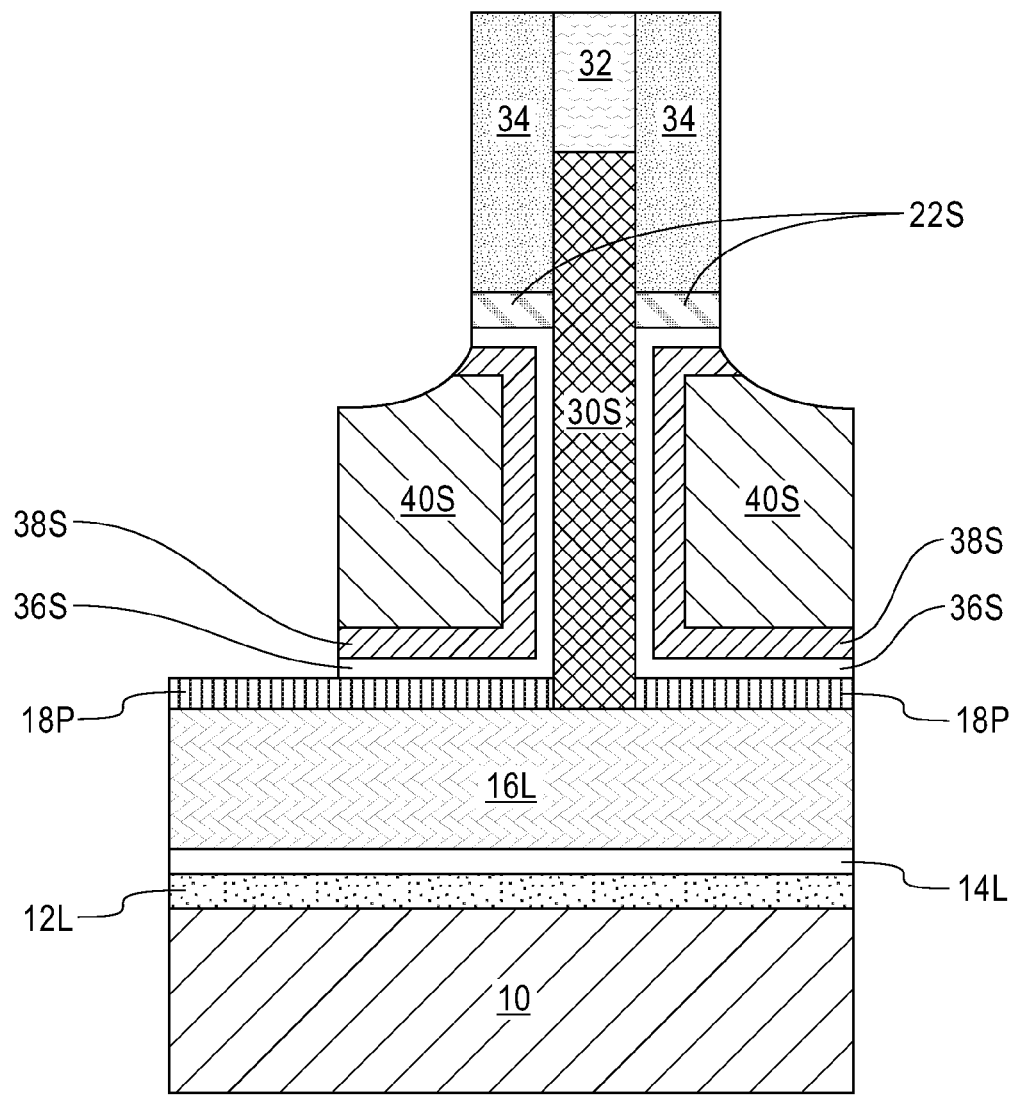
FIG. 16 is a cross sectional view of the exemplary semiconductor structure of FIG. 15 after patterning the gate conductor material and underlying portions of the gate material stack.

Referring now to FIG. 16, there is illustrated the exemplary semiconductor structure of FIG. 15 after patterning the recessed gate conductor material portion 40R, and underlying portions of the gate material stack (i.e., work function metal portions 38R and gate dielectric material portions 36R). A gate structure is provided on each side of the semiconductor channel material structure 30S after the patterning that includes a gate conductor portion 40S, a work function metal portion 38S and a gate dielectric material portion 36S. Patterning may be achieved by lithography and etching.

Figure 17:
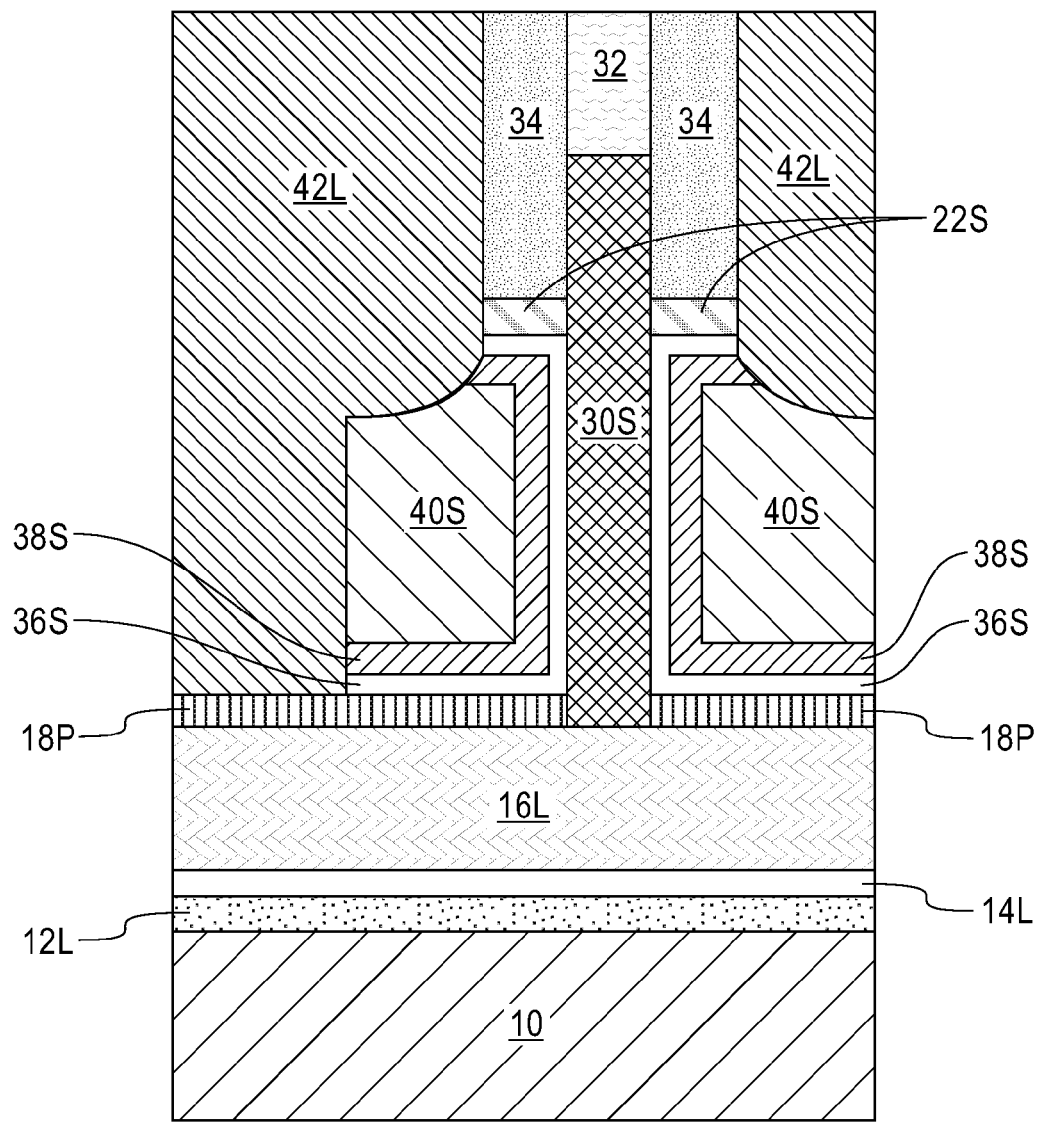
FIG. 17 is a cross sectional view of the exemplary semiconductor structure of FIG. 16 after forming a middle-of-the-line (MOL) dielectric material.

Referring now to FIG. 17, there is illustrated the exemplary semiconductor structure of FIG. 16 after forming a middle-of-the-line (MOL) dielectric material 42L. The MOL dielectric material 42L surrounds the structure shown in FIG. 16 and has a topmost surface that is coplanar with each of the vertical sidewall spacer 34 and the dielectric cap 32.

The MOL dielectric material 42L may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the MOL dielectric material 42L. The use of a self-planarizing dielectric material as MOL dielectric material 42L may avoid the need to perform a subsequent planarizing step.

In one embodiment, the MOL dielectric material 42L can be formed utilizing a deposition process including, for example, chemical vapor deposition (CVD), plasma enhanced chemical vapor deposition (PECVD), evaporation or spin-on coating. In some embodiments, a planarization process or an etch back process follows the deposition of the MOL dielectric material 42L. The thickness of the MOL dielectric material 42L that can be employed in the present application may vary depending on the type of dielectric material employed as well as the method that was employed in forming the same. In one embodiment, the MOL dielectric material 42L has a thickness from 80 nm to 500 nm. Other thicknesses that are greater or lesser than the range provided above can also be used for the MOL dielectric material 42L.

Figure 18:
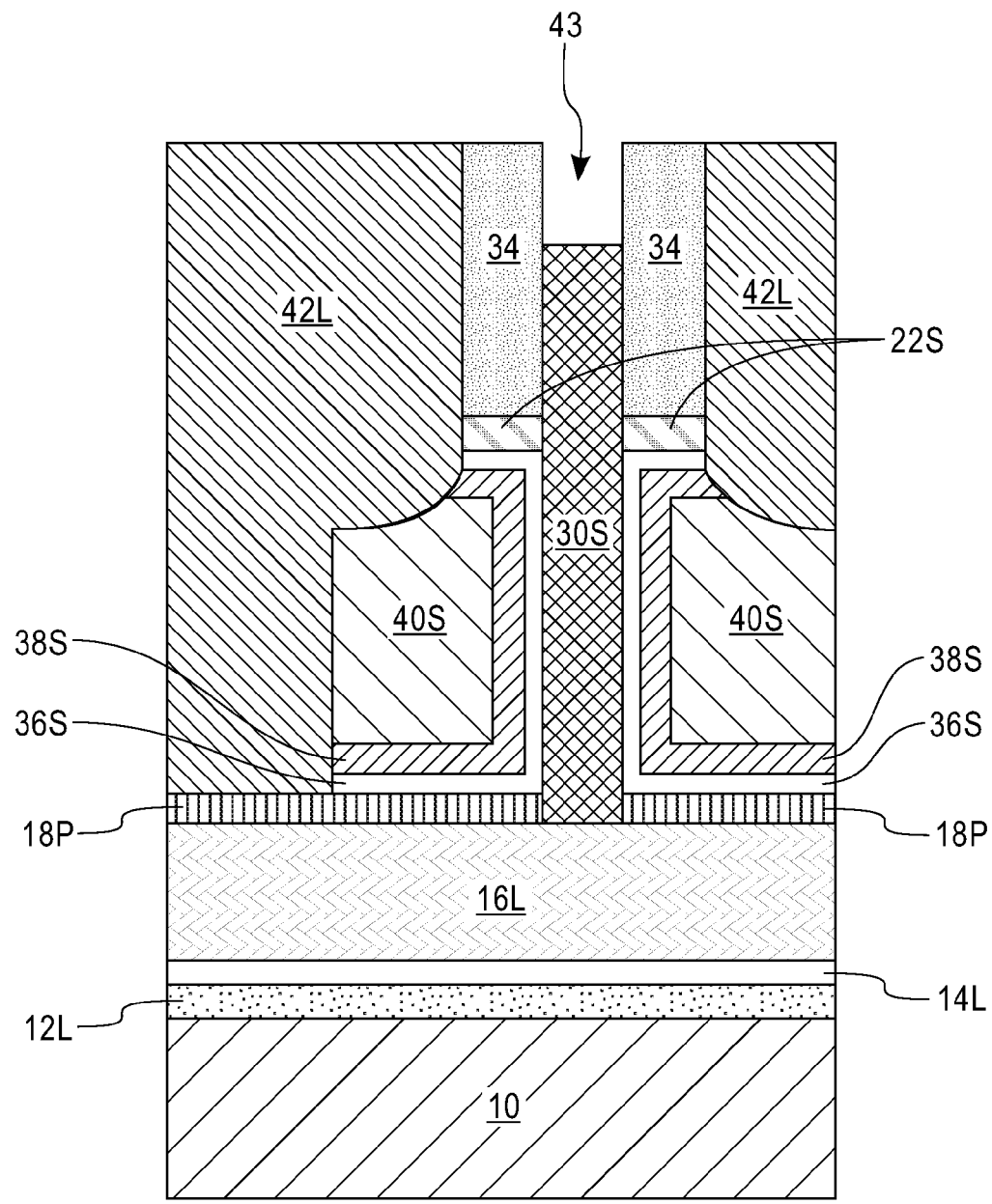
FIG. 18 is a cross sectional view of the exemplary semiconductor structure of FIG. 17 after removing the dielectric cap from atop the remaining portion of the semiconductor channel material.

Referring now to FIG. 18, there is illustrated the exemplary semiconductor structure of FIG. 17 after removing the dielectric cap 32 from atop the remaining portion of the semiconductor channel material, i.e., from atop the semiconductor channel material structure 30S. An opening 43 is formed that exposes a topmost surface of the semiconductor channel material structure 30S. The removal of the dielectric cap 32 may be performed utilizing an etch that is selective in removing the material that provides the dielectric cap 32. In one embodiment and when the dielectric cap 32 is composed of silicon nitride, a hot (around 150° C. to 180° C.) phosphoric acid solution may be used.

Figure 19:
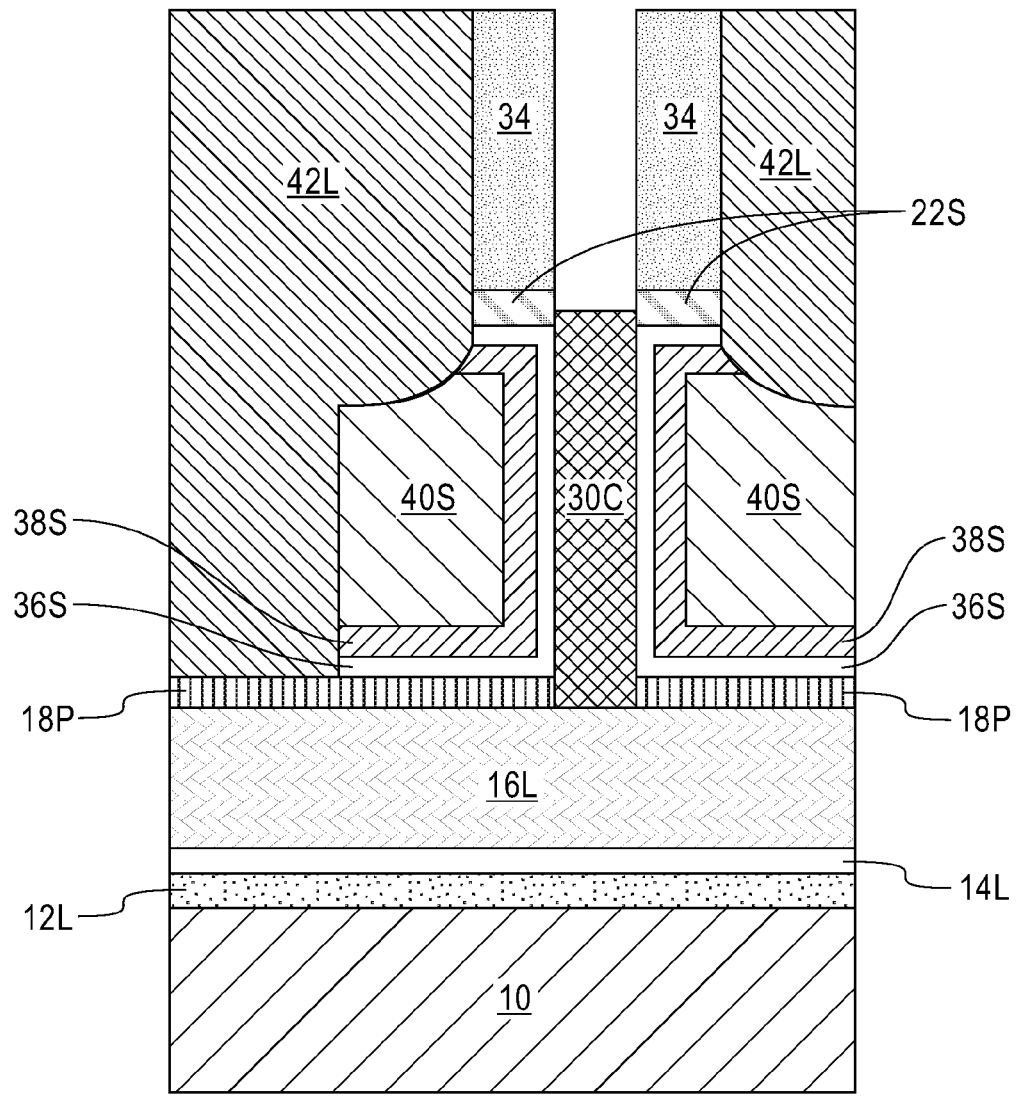
FIG. 19 is a cross sectional view of the exemplary semiconductor structure of FIG. 18 after etching an upper portion of the remaining portion of the semiconductor channel material.

Referring now to FIG. 19, there is illustrated the exemplary semiconductor structure of FIG. 18 after etching an upper portion of the remaining portion of the semiconductor channel material, i.e., the semiconductor channel material structure 30S. A portion of the semiconductor channel material structure 30S remains after the etch. The remaining portion of the semiconductor channel material structure 30S is referred to herein as semiconductor channel region 30C. The etch may include any anisotropic etch including, for example, a wet etch, a dry etch or an epitaxial gas etch. In one embodiment and as is illustrated, the semiconductor channel region 30C has a topmost surface that is located between a topmost surface and a bottommost surface of each top spacer 22S.

Figure 20:
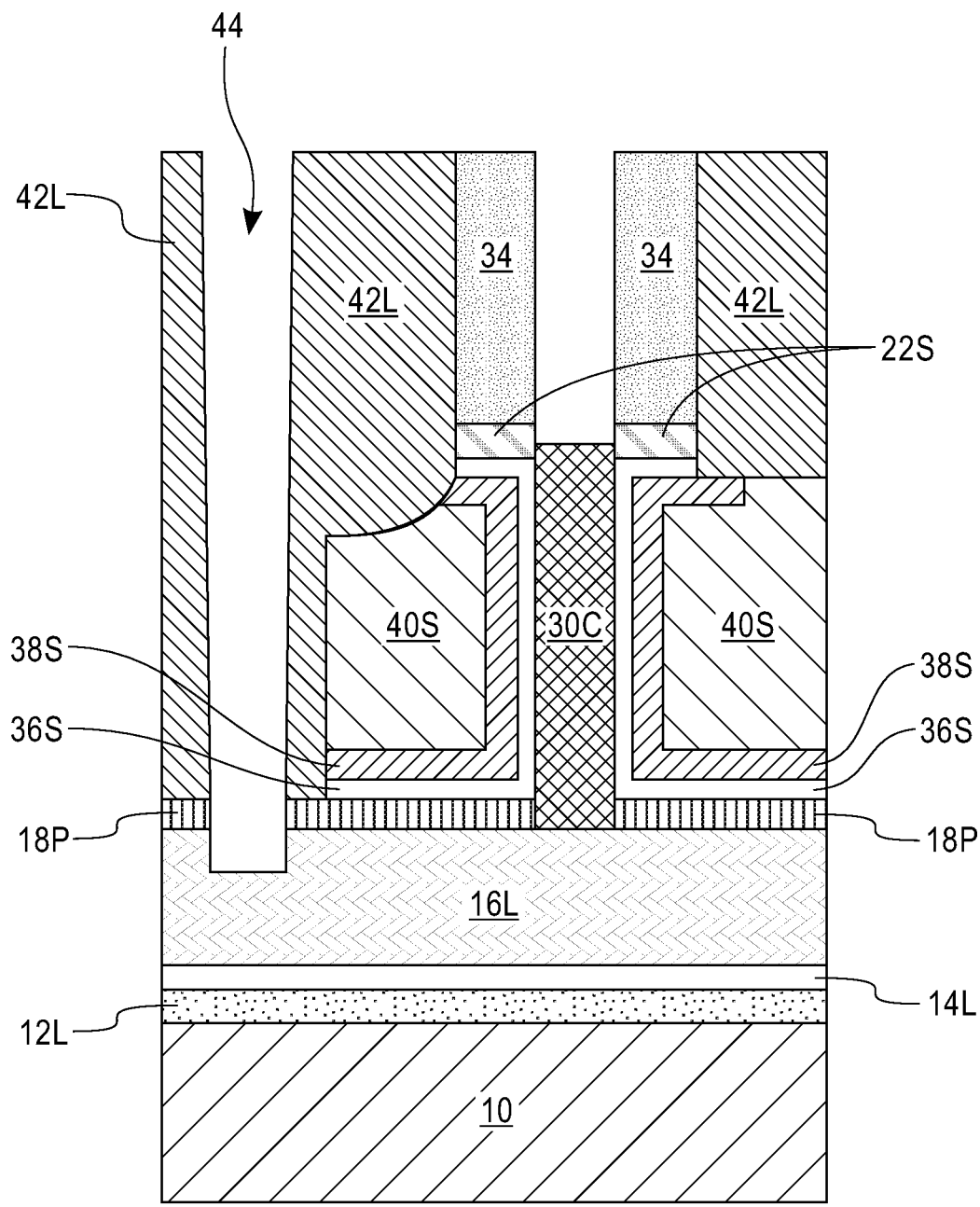
FIG. 20 is a cross sectional view of the exemplary semiconductor structure of FIG. 19 after forming a contact opening exposing a surface of the silicon germanium alloy layer.

Referring now to FIG. 20, there is illustrated the exemplary semiconductor structure of FIG. 19 after forming a contact opening 44 exposing a surface of the silicon germanium alloy layer 16L. The contact opening 44 is formed entirely through a portion of the MOL dielectric material 42L and entirely through a bottom spacer 18P that is located on one side of the semiconductor channel region 30C. The contact opening 44 can be formed by lithography and etching.

Figure 21:
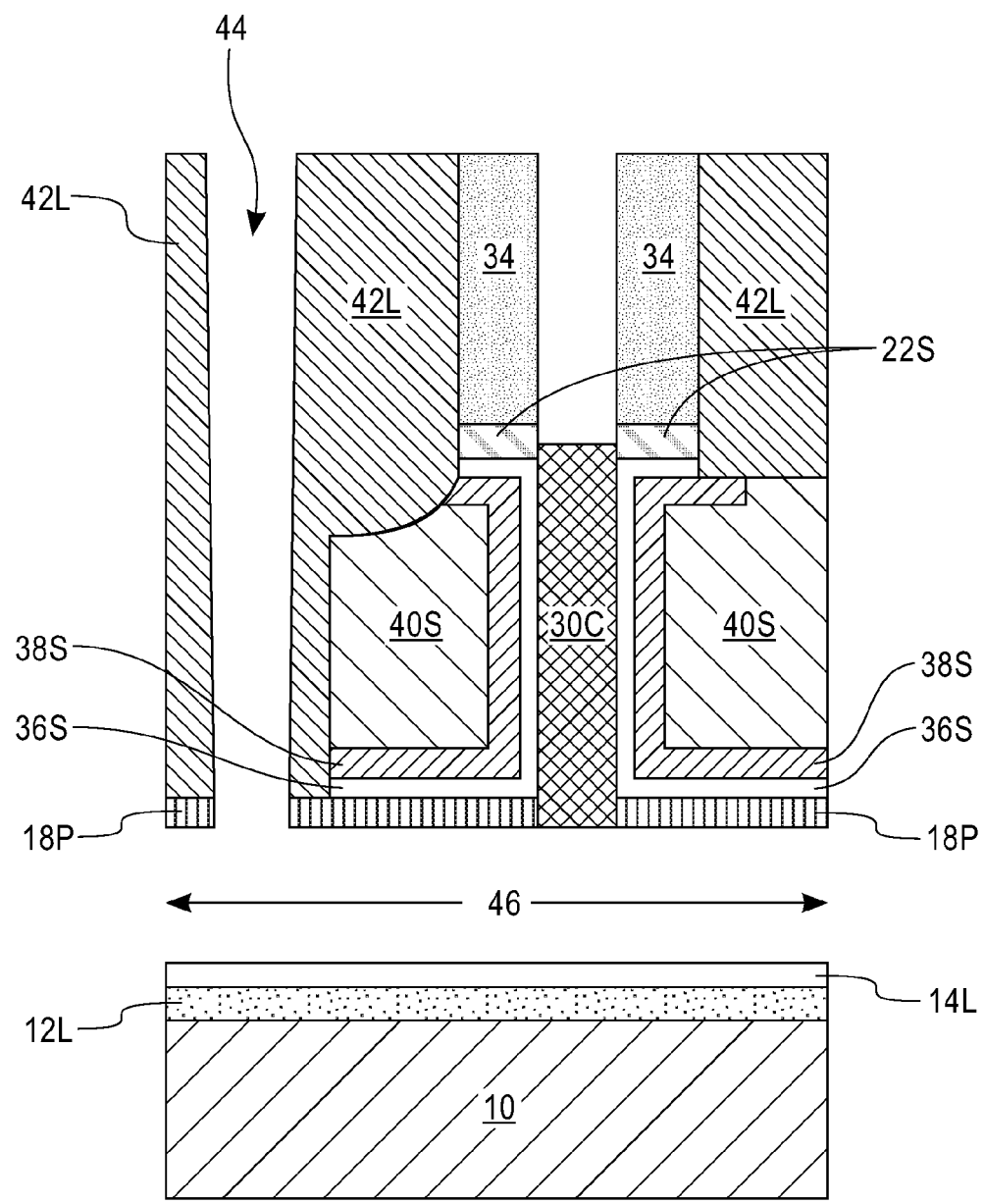
FIG. 21 is a cross sectional view of the exemplary semiconductor structure of FIG. 20 after completely removing the silicon germanium alloy layer to provide a cavity between a remaining portion of the bottom spacer layer and the second semiconductor material layer.

Referring now to FIG. 21, there is illustrated the exemplary semiconductor structure of FIG. 20 after completely removing the silicon germanium alloy layer 16L to provide a cavity 46 between a remaining portion of the bottom spacer layer, i.e., bottom spacer 18P, and the second semiconductor material layer 14L. In one embodiment of the present application, the silicon germanium alloy layer 16L is completely removed utilizing HCl gas.

Figure 22:
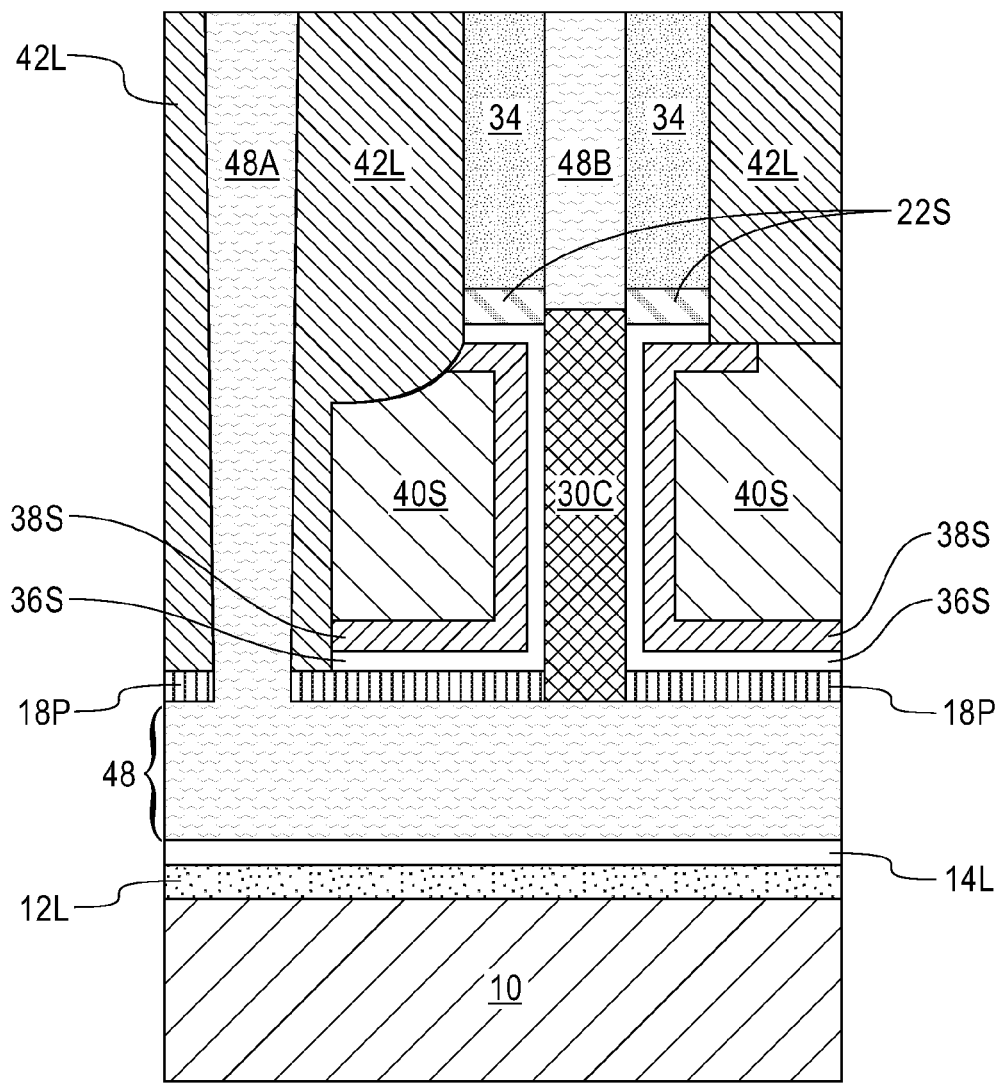
FIG. 22 is a cross sectional view of the exemplary semiconductor structure of FIG. 21 after forming a conductive material in the cavity and in the contact opening as well as atop the recessed semiconductor channel material.

Referring now to FIG. 22, there is illustrated the exemplary semiconductor structure of FIG. 21 after forming a conductive material in the cavity 46 and in the contact opening 46 as well as with opening 43. The conductive material that is used in the present application includes any conductive material that can form a Schottky contact at opposing ends of the semiconductor channel region 30C. In one embodiment, the conductive material is a metal silicide such as, for example, platinum silicide or a rare earth (i.e., one of a set of seventeen chemical elements in the Periodic Table of Elements, specifically the fifteen lanthanides, as well as scandium and yttrium) silicide such as, for example, erbium silicide ($ErSi_x$) or ytterbium silicide ($YbSi_x$). The conductive material that provides the Schottky contact may be formed by a deposition process such as, for example, chemical vapor deposition or plasma chemical deposition. A planarization process may follow the deposition of the conductive material that provides the Schottky contact.

Within the cavity 46 and contact opening 44, a bottom Schottky contact source/drain structure (48, 48A) is provided. The bottom Schottky contact source/drain structure (48, 48A) comprises a base portion 48 and a vertically extending portion 48A. Within opening 43, a top Schottky contact source/drain structure 48B is formed. As is shown, the vertically extending portion 48A of the bottom Schottky contact source/drain structure (48, 48A) has a topmost surface that is coplanar with a topmost surface of the top Schottky contact source/drain structure 48B as well as a topmost surface of the MOL dielectric material 42L. The top and bottom Schottky contact source/drain structures are vertically separated by the semiconductor channel region 30C and are horizontally spaced apart by at least a portion of the MOL dielectric material layer 42L.

Figure 23:
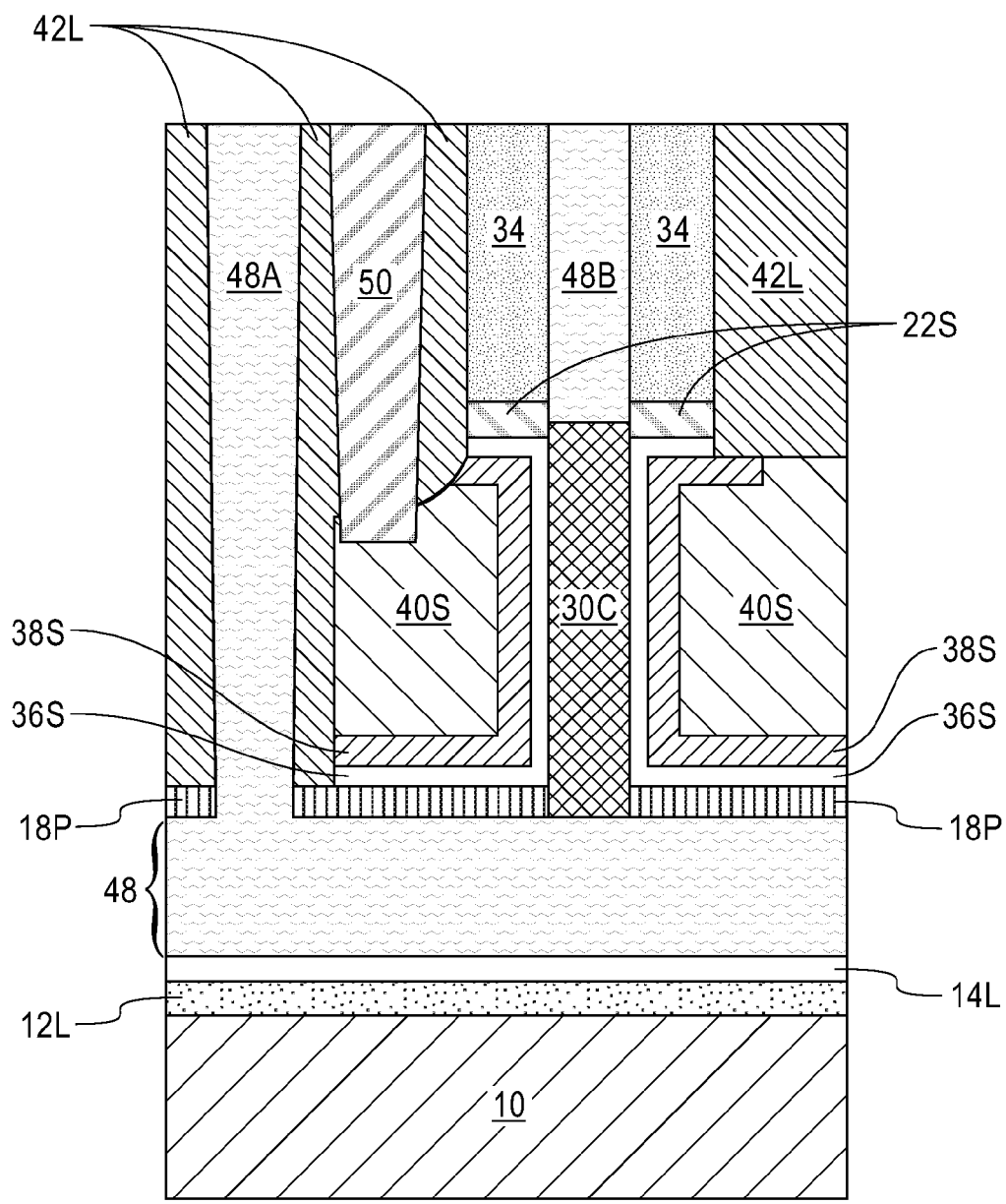
FIG. 23 is a cross sectional view of the exemplary semiconductor structure of FIG. 22 after forming a gate contact structure.

Referring now to FIG. 23, there is shown the exemplary semiconductor structure of FIG. 22 after forming a gate contact structure 50 which contacts a surface of the gate structure (36S, 38S, 40S). The gate contact structure 50 can be formed by lithography and etching to provide another opening in the MOL dielectric material 42L, and then filling the another opening with a contact metal such as, for example, tungsten (W), aluminum (Al), cobalt (Co), copper (Cu) or alloys thereof. The filling of the another opening may include a deposition process followed by a planarization process. As is shown, the gate contact structure 50 has a topmost surface that is coplanar with a topmost surface of each of the vertically extending portion 48A of the bottom Schottky contact source/drain structure, the top Schottky contact source/drain structure 48B and the MOL dielectric material 42L.

Notably, FIG. 23 illustrates one exemplary semiconductor structure of the present application which includes a vertical field effect transistor located above a substrate (10, 12L, 14L). The vertical field effect transistor includes a bottom Schottky contact source/drain structure (48, 48A) located directly on a surface of the substrate (10, 12L, 14L). The bottom Schottky contact source/drain structure (48, 48A) comprises a base portion 48 and a vertically extending portion 48A. The vertical field effect transistor further includes a semiconductor channel region 30C extending vertically upwards from a surface of the base portion 48 of the bottom Schottky contact source/drain structure, a top Schottky contact source/drain structure 48B located on a topmost surface of the semiconductor channel region 30C, and a gate structure (36S, 38S, 40S) located on each side of the semiconductor channel region 30C.

Referring now to FIG. 24, there is illustrated another exemplary semiconductor structure that includes a material stack of a handle substrate 100, an insulator layer 102L, a silicon germanium alloy layer 16L, a bottom spacer layer 18L, a sacrificial gate material layer 20L, a top spacer layer 22L and a dielectric material layer 24L that can be employed in another embodiment of the present application. In this embodiment, the handle substrate 100 may include one of the semiconductor materials mentioned above for the bulk semiconductor substrate. Alternatively, the handle substrate 100 may be omitted. Collectively, and for this embodiment of the present application, the handle substrate 100 and the insulator layer 102L may be referred to as a substrate.

The insulator layer 102L may include a crystalline or non-crystalline oxide or nitride. In one example, the insulator layer 102L may be composed of silicon dioxide. The insulator layer 102L may have a thickness from 10 nm to 100 nm; although other thicknesses are possible and are thus not excluded from being used in the present application.

The silicon germanium alloy layer 16L may be a topmost surface of a SiGe-on-insulator substrate including the handle substrate 100, and the insulator layer 102L. Alternatively, the silicon germanium alloy layer 16L may be formed by a wafer bonding process to the insulator layer 102L. In another embodiment, the silicon germanium alloy layer 16L may be formed utilizing a thermal mixing or thermal condensation process. The silicon germanium alloy layer 16L may have a germanium content and/or a thickness as mentioned in the previous embodiment of the present application.

The remaining layers (i.e., the bottom spacer layer 18L, the sacrificial gate material layer 20L, the top spacer layer 22L and the dielectric material layer 24L) are the same as described in the previous embodiment of the present application. Thus, the various materials, processes and thicknesses described above in forming the bottom spacer layer 18L, the sacrificial gate material layer 20L, the top spacer layer 22L and the dielectric material layer 24L apply for this embodiment of the present application.

Referring now to FIG. 25, there is illustrated the exemplary semiconductor structure of FIG. 24 after performing the various processing steps mentioned in FIGS. 2-23 of the present application. Notably, FIG. 25 illustrates another one exemplary semiconductor structure of the present application which includes a vertical field effect transistor located above a substrate (100, 102L). The vertical field effect transistor includes a bottom Schottky contact source/drain structure (48, 48A) located directly on a surface of the substrate (100, 102L). The bottom Schottky contact source/drain structure (48, 48A) comprises a base portion 48 and a vertically extending portion 48A. The vertical field effect transistor further includes a semiconductor channel region 30C extending vertically upwards from a surface of the base portion 48 of the bottom Schottky contact source/drain structure, a top Schottky contact source/drain structure 48B located on a topmost surface of the semiconductor channel region 30C, and a gate structure (36S, 38S, 40S) located on each side of the semiconductor channel region 30C. As is shown, the gate contact structure 50 has a topmost surface that is coplanar with a topmost surface of each of the vertically extending portion 48A of the bottom Schottky contact source/drain structure, the top Schottky contact source/drain structure 48B and the MOL dielectric material 42L.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, said method comprising:
providing a structure on a surface of a substrate, said structure comprising a semiconductor channel material structure extending vertically upwards from a surface of a silicon germanium alloy layer, wherein a dielectric cap is located on a topmost surface of said semiconductor channel material structure, a bottom spacer is located on each side of said semiconductor channel material structure and in direct contact with said silicon germanium alloy layer, and a top spacer is located on each side of said semiconductor channel material structure and is spaced apart from said bottom spacer;
forming a gate structure on each side of said semiconductor channel material structure, wherein each gate structure comprises a gate dielectric material portion directly contacting an exposed sidewall surface of said semiconductor channel material structure;
forming a middle-of-the-line (MOL) dielectric material adjacent said gate structures and said semiconductor channel material structure;
removing said dielectric cap to expose said topmost surface of said semiconductor channel material structure;
recessing said semiconductor channel material structure to provide a semiconductor channel region;

forming a contact opening in said MOL dielectric material that exposes another surface of said silicon germanium alloy layer;

removing said silicon germanium alloy layer to provide a cavity; and forming a conductive material in said contact opening, said cavity and atop said semiconductor channel region, wherein said conductive material in said contact opening and said cavity provides a bottom Schottky contact source/drain region containing a vertically extending portion and a base portion, and wherein said conductive material formed atop said semiconductor channel region forms a top Schottky contact source/drain region.

2. The method of claim 1, wherein said vertically extending portion of said bottom Schottky contact source/drain structure has a topmost surface that is coplanar with a topmost surface of said top Schottky contact source/drain structure and a topmost surface of said MOL dielectric material.

3. The method of claim 1, further comprising forming a gate contact structure contacting a surface of said gate structure.

4. The method of claim 1, wherein said substrate comprises a bulk semiconductor substrate, a first semiconductor material layer of a first conductivity type located on a surface of said bulk semiconductor substrate, a second semiconductor material layer of a second conductivity type different from said first conductivity type located on a surface of said first semiconductor material layer, and wherein said silicon germanium alloy layer directly contacts a surface of said second semiconductor material layer.

5. The method of claim 1, wherein said substrate comprises a handle substrate and an insulator layer, and wherein said silicon germanium alloy layer directly contacts a surface of said second semiconductor material layer.

6. The method of claim 1, wherein said removing said silicon germanium alloy layer comprises utilizing an HCl gas.

7. The method of claim 1, wherein said top Schottky contact source/drain structure has sidewall surfaces that are vertically aligned to sidewall surfaces of said semiconductor channel region.

8. The method of claim 1, wherein each of said gate structures further comprises a work function metal portion and a gate conductor portion.

9. The method of claim 1, wherein said semiconductor channel material structure comprises a semiconductor material that differs in composition from said silicon germanium alloy layer.

10. The method of claim 1, wherein a vertical sidewall spacer is formed on sidewall surfaces of said dielectric cap and an upper portion of sidewall surfaces of said semiconductor channel material structure prior to forming said gate structure.

* * * * *